(12) United States Patent
Tanaka et al.

(10) Patent No.: US 9,036,362 B2
(45) Date of Patent: May 19, 2015

(54) ELECTRONIC COMPONENT INCORPORATED SUBSTRATE

(71) Applicant: SHINKO ELECTRIC INDUSTRIES CO., LTD., Nagano-ken (JP)

(72) Inventors: Koichi Tanaka, Nagano (JP); Nobuyuki Kurashima, Nagano (JP); Hajime Iizuka, Nagano (JP); Satoshi Shiraki, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 47 days.

(21) Appl. No.: 13/969,814

(22) Filed: Aug. 19, 2013

(65) Prior Publication Data

US 2014/0063764 A1  Mar. 6, 2014

(30) Foreign Application Priority Data

Aug. 29, 2012 (JP) ................................ 2012-188799

(51) Int. Cl.
*H05K 1/18* (2006.01)
*H05K 3/46* (2006.01)
*H05K 3/40* (2006.01)

(52) U.S. Cl.
CPC ...... *H05K 1/185* (2013.01); *H01L 2224/16225* (2013.01); *H01L 2224/32225* (2013.01); *H01L 2224/73204* (2013.01); *H05K 1/186* (2013.01); *H05K 3/4015* (2013.01); *H05K 3/4614* (2013.01); *H05K 2203/061* (2013.01)

(58) Field of Classification Search
USPC .................................. 361/762, 764; 257/690
See application file for complete search history.

(56) References Cited

U.S. PATENT DOCUMENTS

2009/0008765 A1* 1/2009 Yamano et al. ............... 257/690

FOREIGN PATENT DOCUMENTS

WO   WO2007/069606   6/2007

* cited by examiner

*Primary Examiner* — Andargie M Aychillhum
(74) *Attorney, Agent, or Firm* — Fish & Richardson P.C.

(57) ABSTRACT

An electronic component incorporated substrate includes a first substrate and a second substrate that are electrically connected to each other by a spacer unit. An electronic component is mounted on the first substrate and arranged between the first substrate and the second substrate. An encapsulating resin fills a space between the first substrate and the second substrate to encapsulate the electronic component. The spacer unit includes a stacked structure of a metal post and a solder ball stacked in a stacking direction of the first substrate and the second substrate. The spacer unit further includes an insulation layer that is formed on the second substrate and covers a side wall of the metal post.

7 Claims, 19 Drawing Sheets

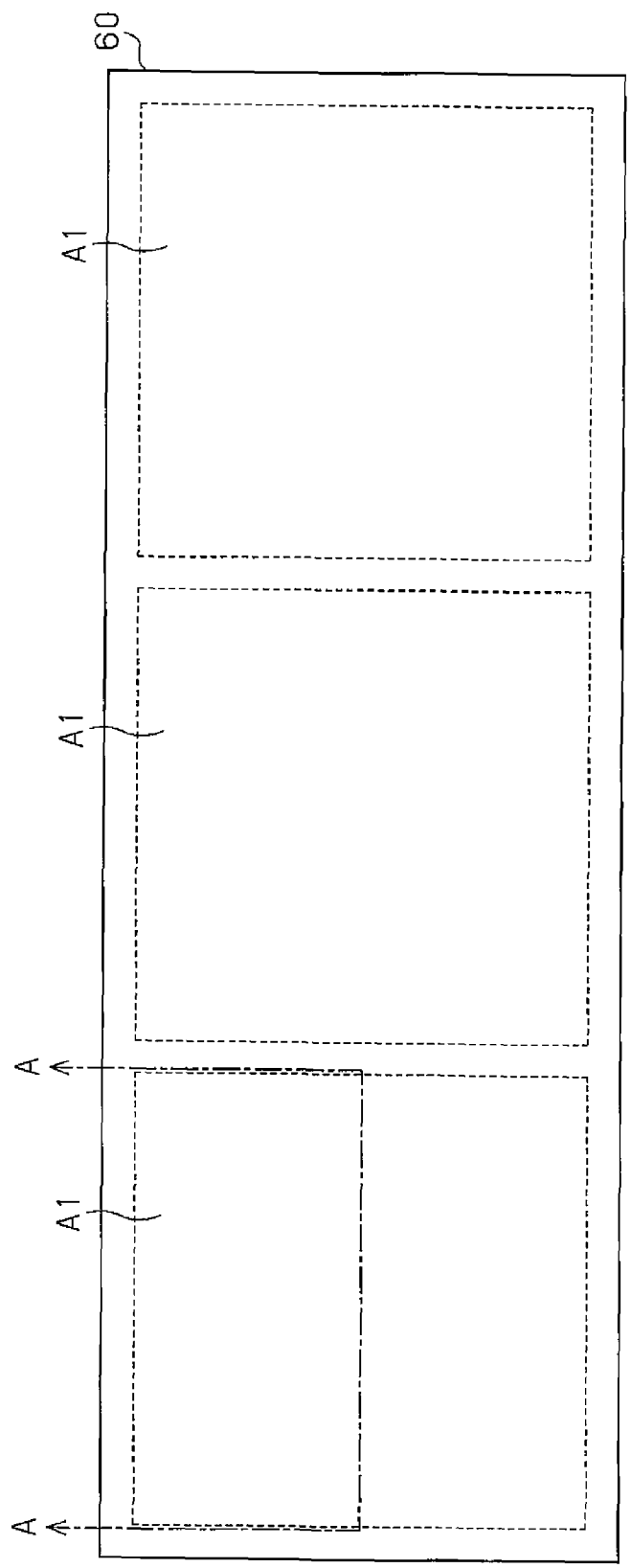

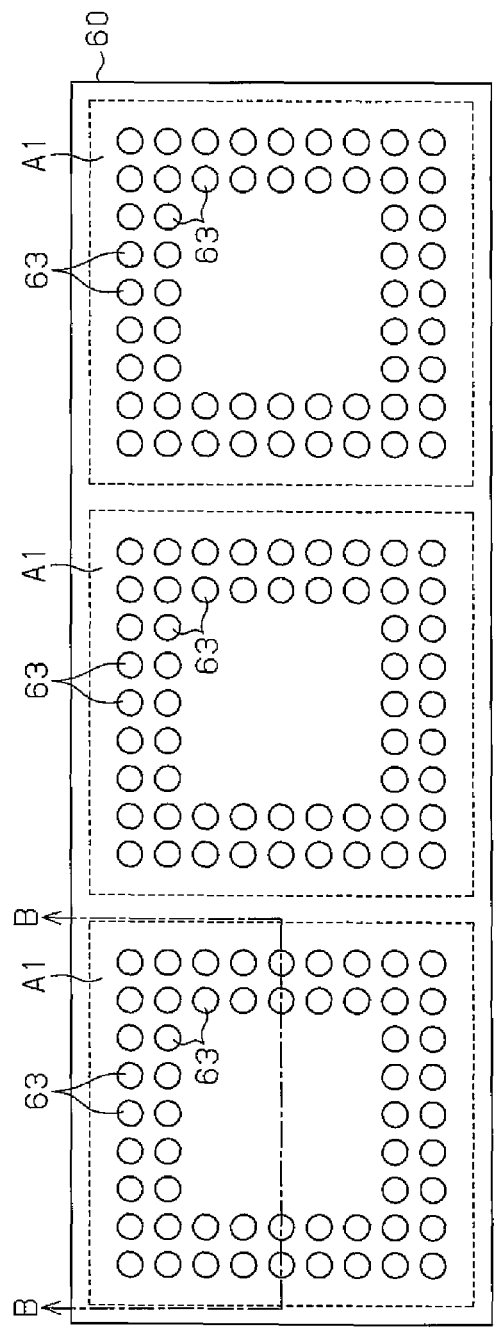
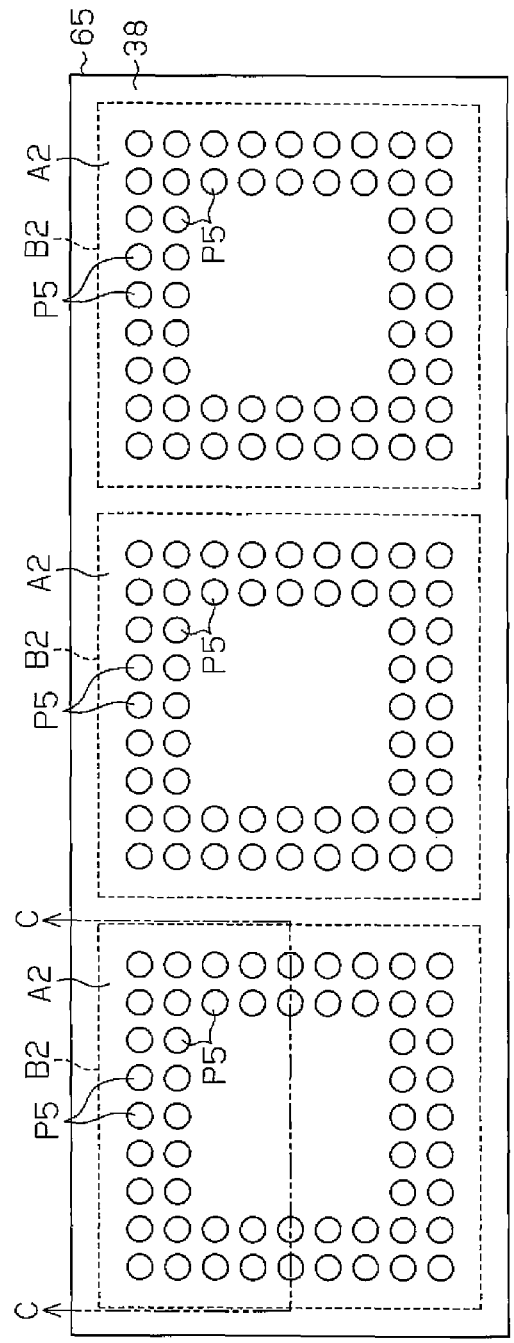
Fig.6A
Fig.6B

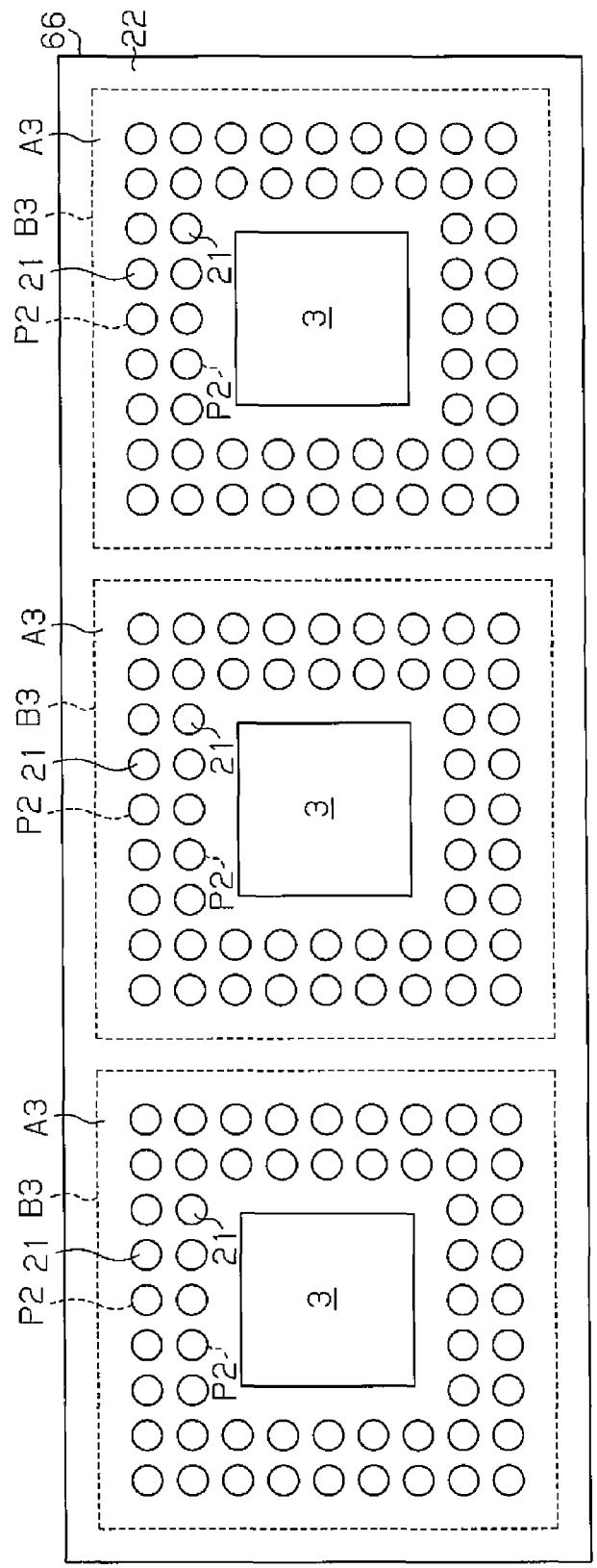

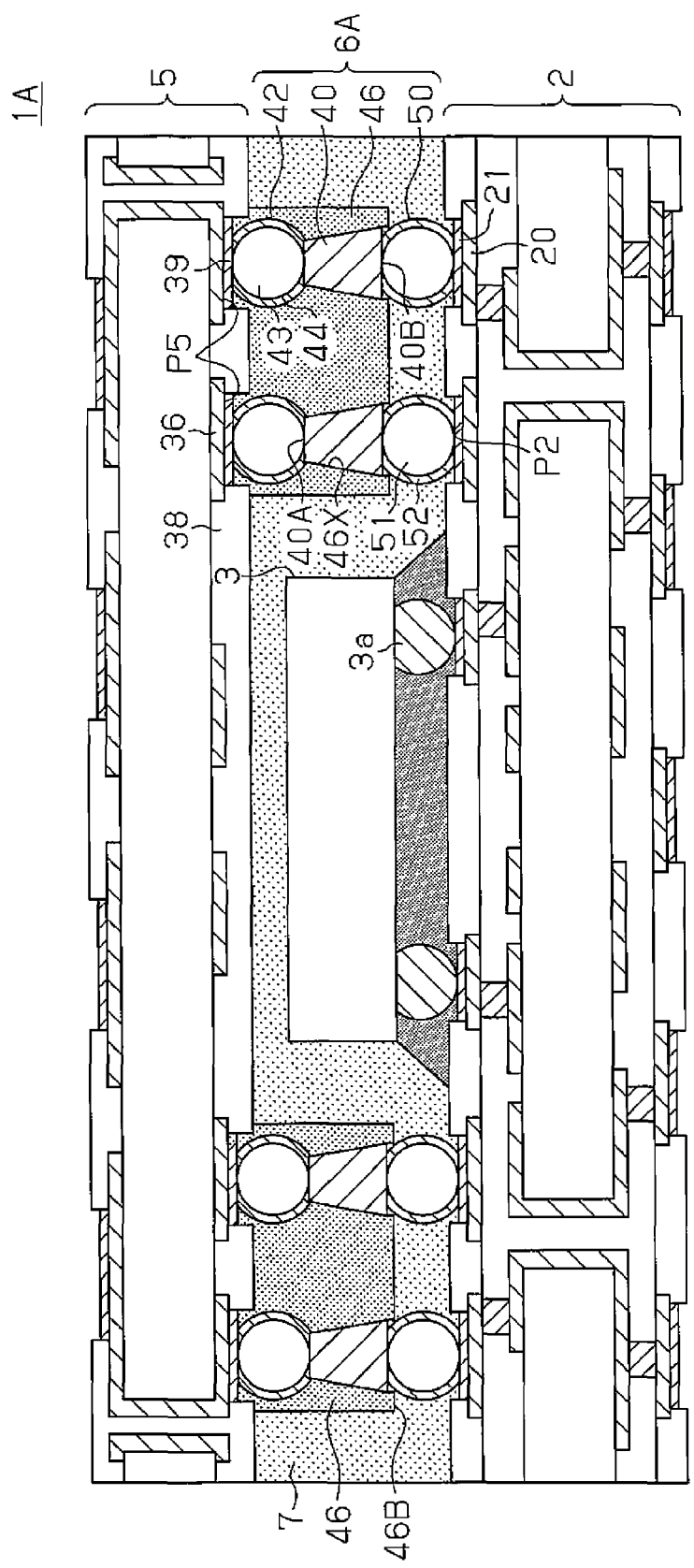

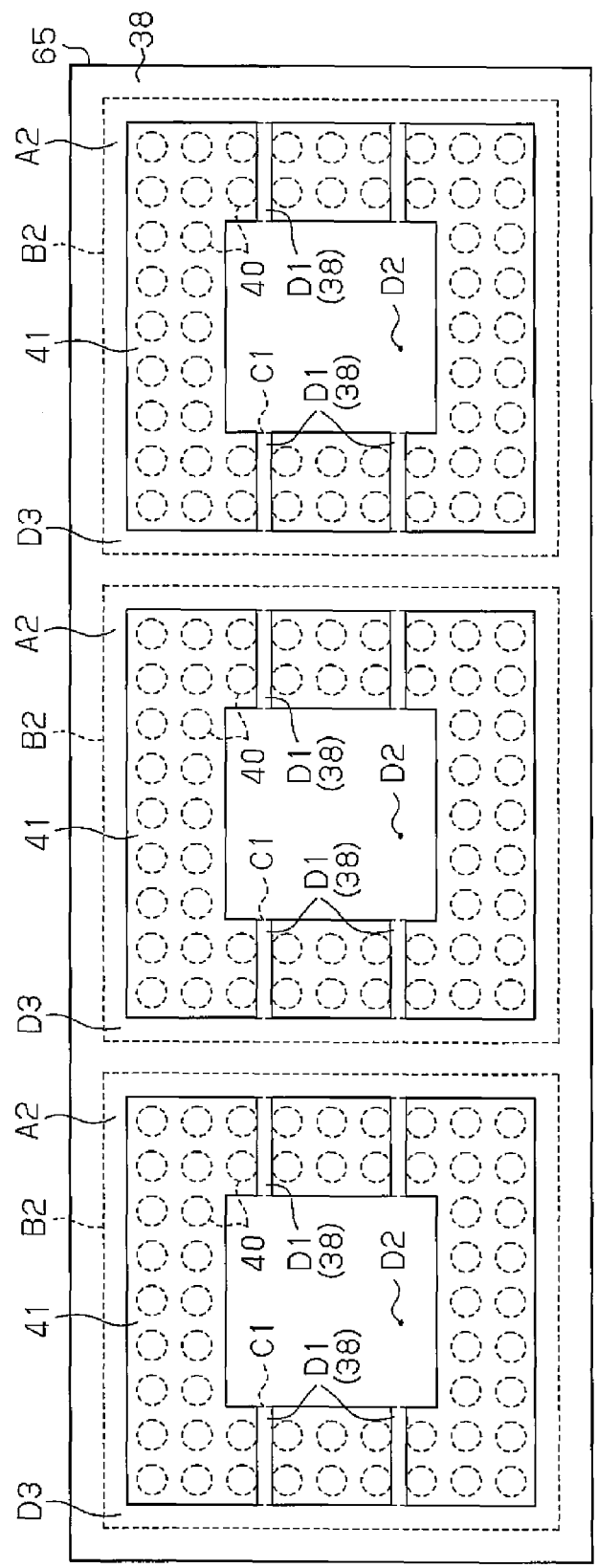

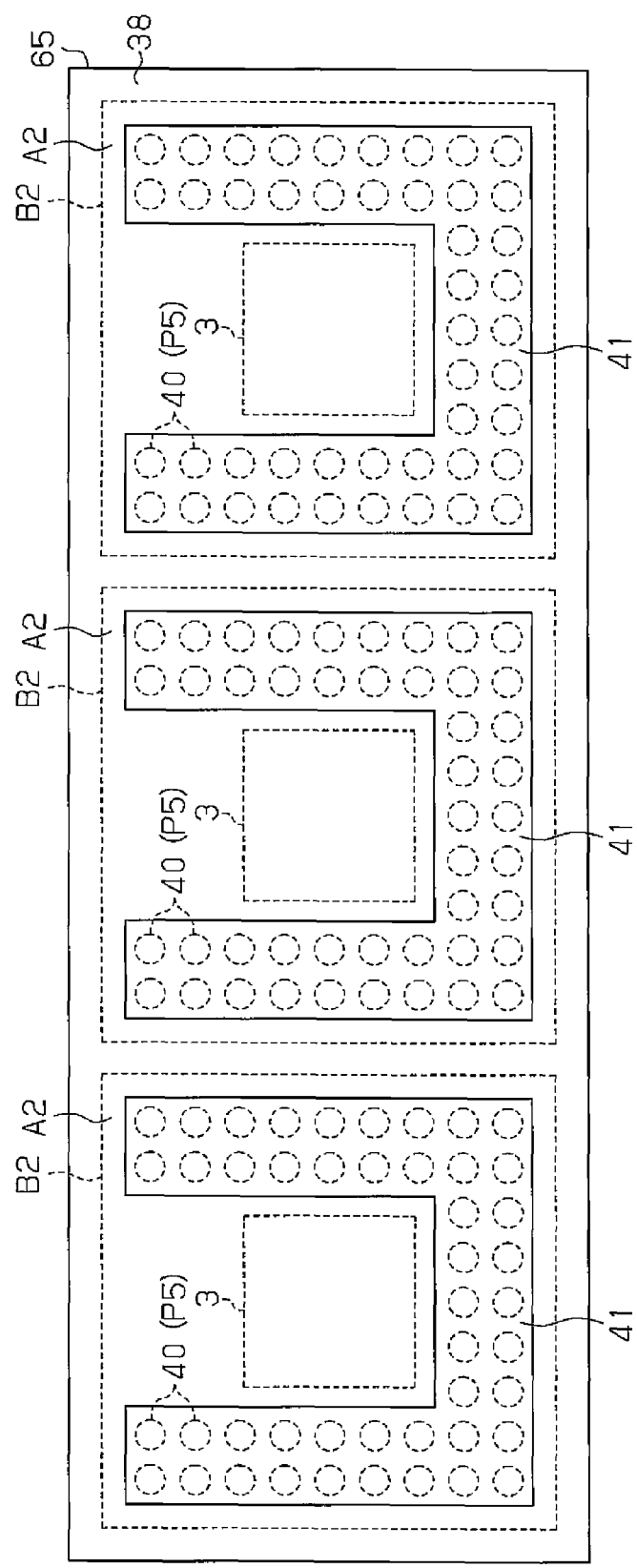

ELECTRONIC COMPONENT INCORPORATED SUBSTRATE

CROSS-REFERENCE TO RELATED APPLICATIONS

This application is based upon and claims the benefit of priority from prior Japanese Patent Application No. 2012-188799, filed on Aug. 29, 2012, the entire contents of which are incorporated herein by reference.

FIELD

This disclosure relates to an electronic component incorporated substrate and a method for manufacturing an electronic component incorporated substrate.

BACKGROUND

International Publication No. 2007/069606 describes one example of a semiconductor package. In the semiconductor package, electronic components are arranged between upper and lower substrates, and the surrounding of the electronic components is filled with an encapsulating resin. In such a semiconductor package, the upper substrate is fixed to the lower substrate with spacers arranged in between to maintain the distance between the upper and lower substrates. Under this situation, the encapsulating resin is filled between the upper and lower substrates.

A copper core solder ball may be used as the spacer. The copper core solder ball has a copper core ball and solder, which encompasses the copper core ball. The solder functions as a bonding material, and the copper core ball functions as a spacer. Solder reflow is performed under a situation in which copper core solder balls are arranged between connection pads of the upper substrate and connection pads of the lower substrate. This solder-bonds the connection pads of the upper substrate and the connection pads of the lower substrate. When the solder melts, the copper core balls are held between the connection pads of the upper substrate and the connection pads of the lower substrate and thereby function as spacers. Accordingly, the size of the copper core balls sets the distance between the upper substrate and the lower substrate, and keeps the distance constant.

SUMMARY

The size of the copper core solder balls is set taking into consideration the height of the electronic components arranged between the upper and lower substrates. Thus, an increase in the height of the electronic components enlarges the size of the copper core solder balls. Each copper core solder ball is spherical. Thus, enlargement of the copper core solder ball to increase the distance between the upper and lower substrates enlarges the dimensions of the copper core solder ball in the lateral direction (direction perpendicular to the stacking direction of the upper and lower substrates), that is, the diameter of the copper core solder ball. Larger copper core solder balls widen the minimum pitch between the solder balls. Accordingly, when the height of the electronic components increases, it becomes difficult to narrow the pitch between connection pads when wiring patterns are miniaturized between the upper and lower substrates.

One aspect of the present invention is an electronic component incorporated substrate including a first substrate, a second substrate, and a spacer unit that electrically connects the first substrate and the second substrate. An electronic component is mounted on the first substrate and arranged between the first substrate and the second substrate. An encapsulating resin fills a space between the first substrate and the second substrate to encapsulate the electronic component. The spacer unit includes a stacked structure of a metal post and a solder ball stacked in a stacking direction of the first substrate and the second substrate. The spacer unit further includes an insulation layer that is formed on the second substrate and covers a side wall of the metal post.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a schematic plan view illustrating a method for manufacturing the electronic component incorporated substrate of FIG. 1;

FIGS. 6A and 6B are schematic plan views illustrating the method for manufacturing the electronic component incorporated substrate of FIG. 1;

FIG. 10 is a schematic plan view illustrating the method for manufacturing the electronic component incorporated substrate of FIG. 1;

FIG. 12 is a schematic cross-sectional view illustrating a second embodiment of an electronic component incorporated substrate;

FIG. 19 is a schematic plan view illustrating an insulation layer in a modification; and FIG. 20 is a schematic plan view illustrating the layout of metal posts in a modification.

DESCRIPTION OF THE EMBODIMENTS

Embodiments will now be described with reference to the drawings. To facilitate understanding, the drawings do not depict actual scale. Further, the cross-sectional views may not include hatching lines.

A first embodiment will now be described with reference to FIGS. 1 to 11C.

Figure 1:
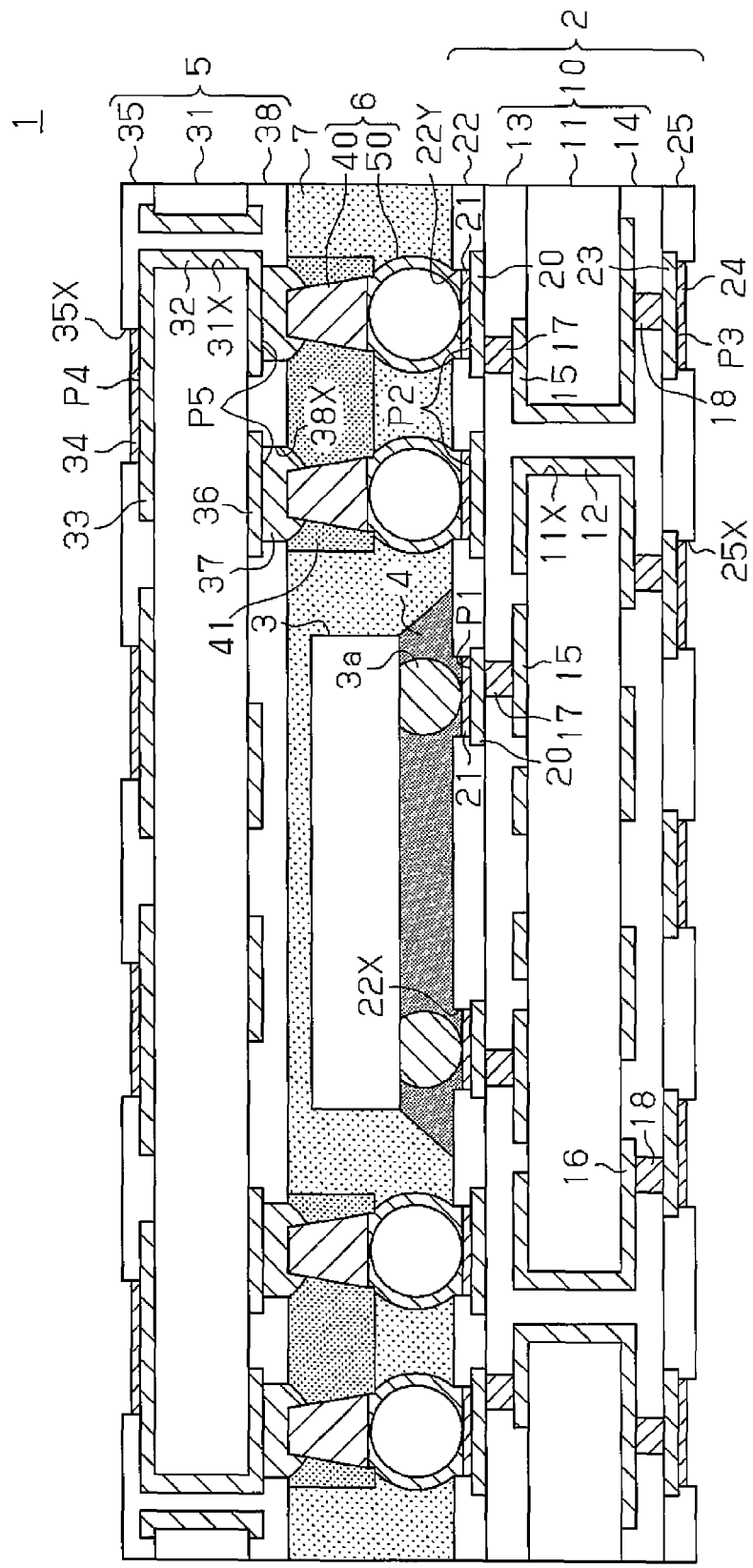
FIG. 1 is a schematic cross-sectional view illustrating a first embodiment of an electronic component incorporated substrate.

Referring to FIG. 1, an electronic component incorporated substrate 1 includes a first substrate 2, a semiconductor chip 3, an underfill resin 4, a second substrate 5, spacer units 6, and an encapsulating resin 7.

The first substrate 2 includes a substrate body 10, a wiring pattern 20 of an uppermost layer, a metal layer 21, a solder resist layer 22, a wiring pattern 23 of a lowermost layer, a metal layer 24, and a solder resist layer 25.

The substrate body 10 includes a substrate core 11, through electrodes 12 formed in through holes 11X of the substrate core 11, insulation layers 13 and 14 stacked on the substrate core 11, wires 15 and vias 17 formed in the insulation layer 13, and wires 16 and vias 18 formed in the insulation layer 14. The through electrodes 12, the wires 15 and 16, and the vias 17 and 18 electrically connect the wiring pattern 20 and the wiring pattern 23. An insulative resin such as glass epoxy resin may be used as the material of the substrate core 11. Copper (Cu) or a copper alloy may be used as the material of the through electrodes 12, the wires 15 and 16, and the vias 17 and 18. An insulative resin such as epoxy resin or polyimide resin may be used as the material of the insulation layer 13 and 14.

The substrate core 11 includes a mounting surface (upper surface as viewed in FIG. 1) on which the semiconductor chip 3 is mounted. The wiring pattern 20 is arranged on the mounting surface of the substrate core 11. Copper or a copper alloy may be used as the material of the wiring pattern 20. The wiring pattern 20 functions as chip pads P1, which are electrically connected to bumps 3a of the semiconductor chip 3, and connection pads P2, which electrically connects the first substrate 2 and the second substrate 5. Although not illustrated in the drawings, when viewed from above, the chip pads P1 are arranged in the mounting region of the semiconductor chip 3 in, for example, a matrix array in correspondence with the layout of the bumps 3a of the semiconductor chip 3. Each chip pad P1 has, for example, a circular shape as viewed from above.

Figure 2:
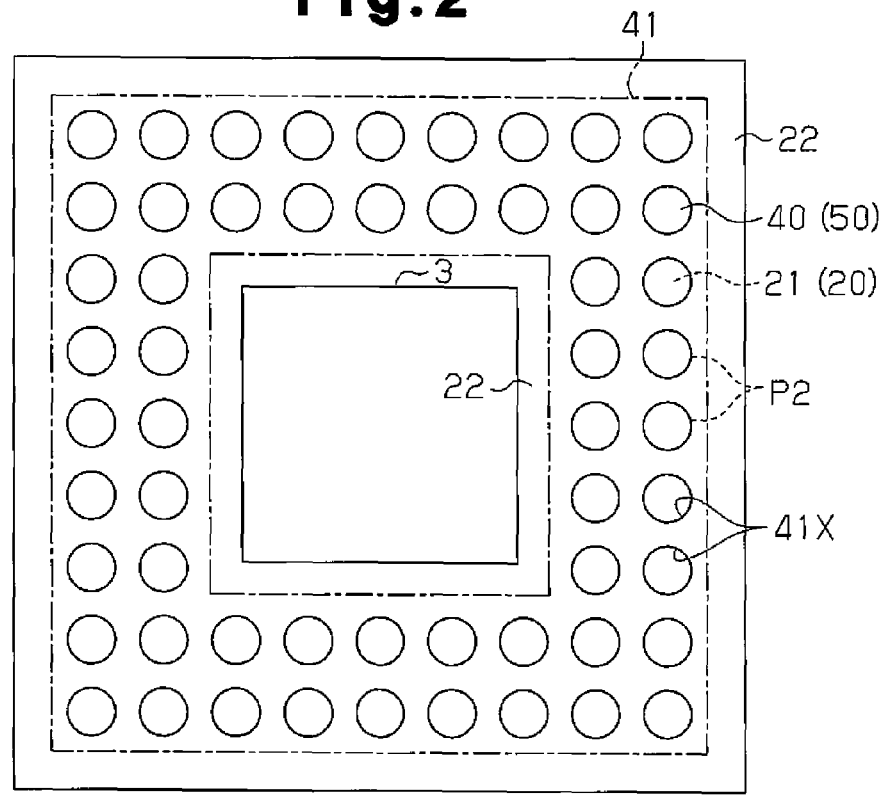
FIG. 2 is a schematic plan view illustrating the electronic component incorporated substrate of FIG. 1 with certain members removed from the electronic component incorporated substrate.

Referring to FIG. 2, the connection pads P2 are arranged in lines (here, two lines) surrounding the peripheral edge of the semiconductor chip 3. Each connection pad P2 has, for example, a circular shape as viewed from above. Certain members, such as the second substrate 5 and the encapsulating resin 7 of FIG. 1, are removed in FIG. 2.

As illustrated in FIG. 1, the solder resist layer 22 is arranged on the upper surface of the insulation layer 13 to cover portions of the wiring pattern 20. An insulative resin such as epoxy resin may be used as the material of the solder resist layer 22. The solder resist layer 22 includes a plurality of openings 22X and a plurality of openings 22Y. Each opening 22X exposes a portion of the wiring pattern 20 as a chip pad P1. Each opening 22Y exposes a portion of the wiring pattern 20 as a connection pad P2. The metal layer 21 is formed on the wiring pattern 20 exposed from the openings 22X and 22Y, that is, on the chip pads P1 and the connection pads P2. For example, the metal layer 21 may be formed by sequentially stacking a nickel (Ni) layer and a gold (Au) layer from the upper surface of the wiring pattern 20. The metal layer 21 may also be formed by sequentially stacking an Ni layer, a palladium (Pd) layer, and an Au layer from the upper surface of the wiring pattern 20. Alternatively, the metal layer 21 may be formed by sequentially stacking an Ni layer, a Pd layer, and a silver (Ag) layer from the upper surface of the wiring pattern 20 or by sequentially stacking an Ni layer, a Pd layer, an Ag layer, and an Au layer from the upper surface of the wiring pattern 20. The Ni layer is a metal layer of Ni or Ni alloy. The Au layer is a metal layer of Au or Au alloy. The Pd layer is a metal layer of Pd or Pd alloy. The Ag layer is a metal layer of Ag or Ag alloy. When the metal layer 21 is formed by an Ni layer and an Au layer, the Ni layer may have a thickness of approximately 0.05 to 5 μm, and the Au layer may have a thickness of approximately 0.01 to 1 μm. When the metal layer 21 covers the chip pad P1, the metal layer 21 functions as a chip pad. Further, when the metal layer 21 covers the connection pad P2, the metal layer 21 functions as a connection pad.

The wiring pattern 23 is arranged on a lower surface of the substrate body 10. The wiring pattern 23 includes connection pads P3. External connection terminals such as solder balls or lead pins used when mounting the first substrate 2 on a mounting substrate such as a motherboard are arranged on the external connection pads P3. Although not illustrated in the drawings, the external connection pads P3 are arranged in, for example, a matrix array as viewed from above. Each external connection pad P3 has, for example, a circular shape as viewed from above.

The solder resist layer 25 is arranged on the lower surface of the insulation layer 14 to cover portions of the wiring pattern 23. An insulative resin such as epoxy resin may be used as the material of the solder resist layer 25. The solder resist layer 25 includes a plurality of openings 25X. Each opening 25X exposes a portion of the wiring pattern 23 as an external connection pad P3. The metal layer 24 is formed on the wiring pattern 23 exposed from the openings 25X, that is, on the external connection pads P3. For example, the metal layer 24 may be formed by sequentially stacking an Ni layer and an Au layer from the lower surface of the wiring pattern 23. The metal layer 24 may also be formed by sequentially stacking an Ni layer, a Pd layer, and an Au layer from the lower surface of the wiring pattern 23. Alternatively, the metal layer 24 may be formed by sequentially stacking an Ni layer, a Pd layer, and an Ag layer from the lower surface of the wiring pattern 23 or by sequentially stacking an Ni layer, a Pd layer, an Ag layer, and an Au layer from the lower surface of the wiring pattern 23. When the metal layer 24 is formed by an Ni layer and an Au layer, the Ni layer may have a thickness of approximately 0.05 to 5 μm, and the Au layer may have a thickness of approximately 0.01 to 1 μm. When the metal layer 24 covers the external connection pad P3, the metal layer 24 functions as an external connection pad.

An organic solderbility preservative (OSP) treatment may be performed on the wiring pattern 23 exposed from each opening 25X to form an OSP film. In this case, an external connection terminal may be connected to the OSP film instead of the metal layer 24. Further, the wiring pattern 23 exposed from each opening 25X may be used as an external connection terminal. When the metal layer 24 or the OSP film is formed on the wiring pattern 23, the metal layer 24 or the OSP film may be used as the external connection terminal.

The semiconductor chip 3 is flip-chip mounted on the first substrate 2 having the above structure. In other words, the bumps 3a arranged on the circuit formation surface (lower surface as viewed in FIG. 1) of the semiconductor chip 3 are bonded to the metal layer 21 on the chip pads P1. This bonds the semiconductor chip 3 in a face-down state to the first substrate 2. The bumps 3a and the metal layer 21 electrically connect the semiconductor chip 3 to the chip pads P1 of the first substrate 2.

The semiconductor chip 3 may be logic chip such as a central processing unit (CPU) chip or a graphics processing unit (GPU) chip. The semiconductor chip 3 may also be a memory chip such as a dynamic random access memory (DRAM) chip, a static random access memory (SRAM) chip, or a flash memory. The semiconductor chip 3 may have the dimensions of, for example, approximately 3 mm×3 mm to 12 mm×12 mm as viewed from above. Further, the semiconductor chip 3 may have a thickness of, for example, approximately 50 to 100 μm.

Gold bumps or solder bumps may be used as the bumps 3a. Examples of the material for solder bumps include an alloy containing lead (Pb), an alloy of tin (Sn) and Au, an alloy of Sn and Cu, an alloy of Sn and Ag, and an alloy of Sn, Ag, and Cu. The bumps 3a may have a height of, for example, approximately 20 to 70 μm.

The semiconductor chip 3 is mounted on the first substrate 2. Instead, a different electronic component (e.g., capacitor or inductor) may be mounted on the first substrate 2.

The underfill resin 4 is arranged to fill the gap between the upper surface of the first substrate 2 and the lower surface of the semiconductor chip 3. The underfill resin 4 increases the connection strength between the bumps 3a and the chip pads P1 (metal layer 21), suppresses corrosion of the wiring pattern 20 and the generation of electromigration, and thereby prevents the reliability of the wiring pattern 20 and the metal layer 21 from decreasing. An insulative resin such as epoxy resin may be used as the material of the underfill resin 4.

The structure of the second substrate 5 will now be described. The second substrate 5 includes a substrate core 31, through electrodes 32 formed in through holes 31X of the substrate core 31, a wiring pattern 33 of an uppermost layer, a metal layer 34, a solder resist layer 35, a wiring pattern 36 of a lowermost layer, and a solder resist layer 38. The through electrodes 32 electrically connect the wiring pattern 33 and the wiring pattern 36. An insulative resin such as glass epoxy resin may be used as the material of the substrate core 31.

The substrate core 31 includes a mounting surface (upper surface as viewed in FIG. 1) on which an electronic component other than the semiconductor chip 3, such as another semiconductor chip or passive element, is mounted. The wiring pattern 33 is arranged on the mounting surface of the substrate core 31. Copper or a copper alloy may be used as the material of the wiring pattern 33. The wiring pattern 33 includes component connection pads P4, which are electrically connected to the electronic component other than the semiconductor chip 3. Each component connection pad P4 has, for example, a circular shape as viewed from above.

The solder resist layer 35 is arranged on the upper surface of the substrate core 31 to cover portions of the wiring pattern 33. An insulative resin such as epoxy resin may be used as the material of the solder resist layer 35. The solder resist layer 35 includes a plurality of openings 35X. Each opening 35X exposes a portion of the wiring pattern 33 as a component connection pad P4. The metal layer 34 is formed on the wiring pattern 33 exposed from the openings 35X, that is, on the component connection pads P4. For example, the metal layer 34 may be formed by sequentially stacking an Ni layer and an Au layer from the upper surface of the wiring pattern 33. The metal layer 34 may also be formed by sequentially stacking an Ni layer, a Pd layer, and an Au layer from the upper surface of the wiring pattern 33. Alternatively, the metal layer 34 may be formed by sequentially stacking an Ni layer, a Pd layer, and an Ag layer from the upper surface of the wiring pattern 33 or by sequentially stacking an Ni layer, a Pd layer, an Ag layer, and an Au layer from the upper surface of the wiring pattern 33. When the metal layer 34 is formed by an Ni layer and an Au layer, the Ni layer may have a thickness of approximately 0.05 to 5 μm, and the Au layer may have a thickness of approximately 0.01 to 1 μm. When the metal layer 34 covers the component connection pad P4, the metal layer 34 functions as a component connection pad.

The wiring pattern 36 is arranged on a surface (lower surface as viewed in FIG. 1) of the substrate core 31 opposite to the mounting surface. The wiring pattern 36 includes connection pads P5 that electrically connect the first substrate 2 and the second substrate 5. Each of the connection pads P5 is arranged opposing a corresponding one of the connection pads P2 formed on the first substrate 2. That is, the connection pads P5 are arranged in lines (here, two lines) surrounding the peripheral edge of the semiconductor chip 3 as viewed from above. Each connection pad P5 has, for example, a circular shape as viewed from above.

The solder resist layer 38 is arranged on the lower surface of the substrate core 31 to cover portions of the wiring pattern 36. An insulative resin such as epoxy resin may be used as the material of the solder resist layer 38. The solder resist layer 38 includes a plurality of openings 38X. Each opening 38X exposes a portion of the wiring pattern 36 as a connection pad P5. A solder layer 37 is formed on the wiring pattern 36 exposed from each opening 38X, that is, on each connection pad P5. A solder plating of lead-free solder (e.g., Sn-2.5Ag) may be used as the solder layer 37. The solder layer 37 has a height of, for example, 5 to 10 μm.

A spacer unit 6 is bonded to each solder layer 37. The spacer unit 6 is also bonded to the corresponding connection pad P2 (metal layer 21) of the first substrate 2. In other words, each spacer unit 6 is arranged between the first substrate 2 and the second substrate 5. Further, each spacer unit 6 includes one end bonded to the solder layer 37 and another end bonded to the metal layer 21. The spacer unit 6 functions as a connection terminal that electrically connects the connection pad P2 of the first substrate 2 and the connection terminal P5 of the second substrate 5. Further, the spacer unit 6 functions as a spacer that maintains the distance (separated distance) between the first substrate 2 and the second substrate 5 at a specified value. The spacer units 6 have a height set to be greater than the total thickness of the semiconductor chip 3 and the bumps 3a. The spacer units 6 may have a height of, for example, 150 to 250 μm.

Each spacer unit 6 has a stacked structure of a metal post 40 and a cored solder ball 50 that are stacked in the stacking direction of the first substrate 2 and the second substrate 5. The metal post 40 is a rod-shaped connection terminal and bonded to the cored solder ball 50. In the present example, the metal post 40 is a copper post, and the cored solder ball 50 is a copper core solder ball. The metal post 40 is bonded to the corresponding connection pad P5 (solder layer 37), and the cored solder ball 50 is bonded to the corresponding connection pad P2 (metal layer 21).

A gap or space between the first substrate 2 and the second substrate 5 is filled by the encapsulating resin 7. The encapsulating resin 7 fixes the second substrate 5 to the first substrate 2 and encapsulates the semiconductor chip 3. In other words, the encapsulating resin 7 functions as an adhesive that adheres the first substrate 2 and the second substrate 5. The encapsulating resin 7 also functions as a protection layer that protects the semiconductor chip 3. An insulative resin such as epoxy resin or polyimide resin may be used as the material of the encapsulating resin 7. The encapsulating resin 7 may be a molded resin formed through a transfer mold process, a compression mold process, or an injection mold process.

The structure of each spacer unit 6 will now be described in further detail.

Figure 3:
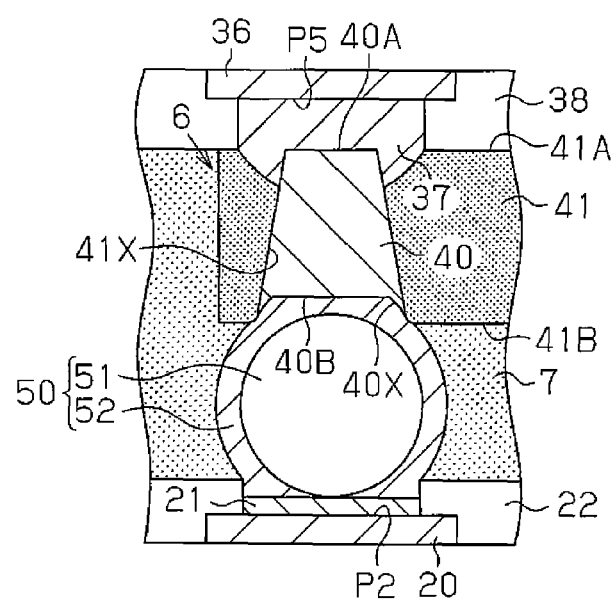
FIG. 3 is an enlarged cross-sectional view illustrating a spacer unit in the first embodiment.

Referring to FIG. 3, the spacer unit 6 includes the stacked structure of the metal post 40 and the cored solder ball 50 and an insulation layer 41, which covers a side wall of the metal post 40. The metal post 40 includes a lower surface 40B (first surface) exposed from the insulation layer 41 and bonded to the cored solder ball 50.

The metal post 40 includes an upper surface 40A bonded to the solder layer 37 on the corresponding connection pad P5. The solder layer 37 electrically connects the metal post 40 to the connection pad P5. The metal post 40 extends downward from the solder layer 37. The metal post 40 may have, for example, a tapered shape with a diameter that decreases from the lower surface 40B toward the upper surface 40A. In other words, the metal post 40 of the present example has the shape of a generally truncated cone of which the lower surface 40B has a larger diameter than the upper surface 40A. The metal post 40 may have a height of, for example, approximately 50 to 100 μm. The lower surface 40B of the metal post 40 may have a diameter of, for example, approximately 50 to 100 μm. Copper or a copper alloy may be used as the material of the metal post 40.

The insulation layer 41 includes a lower surface 41B (first surface) located downward from the lower surface 40B of the metal post 40. Thus, the lower surface 40B of the metal post 40 and the lower surface 41B of the insulation layer 41 form a step (recess). Further, the lower surface 40B of the metal post 40 includes a recess 40X. The recess 40X has a bowl-shaped cross-section that hollows toward the upper surface 40A of the metal post 40. The recess 40X has a flat bottom surface and an oblique side wall. That is, the recess 40X has a tapered shape with a diameter that decreases from the lower surface 41B of the insulation layer 41 toward the bottom surface of the recess 40X. In other words, the recess 40X is formed so that the distance between the side wall of the recess 40X and the outer surface of the metal post 40 decreases from the bottom surface of the recess 40X toward the lower surface 41B of the insulation layer 41. Further, the edge of the bottom surface of the recess 40X is chamfered to have a round shape.

The insulation layer 41 is formed on the lower surface of the solder resist layer 38 to cover the side wall of the metal post 40 and the solder layer 37. A through hole 41X extends through the insulation layer 41 in a thickness-wise direction at a certain location where the metal post 40 is formed. The through hole 41X accommodates the metal post 40 and a portion of the solder layer 37. As illustrated in FIG. 2, the insulation layer 41 may be frame-shaped as viewed from above to surround the peripheral edge of the semiconductor chip 3. The through holes 41X are arranged in lines (here, two lines) along the peripheral edge of the semiconductor chip 3 as viewed from above.

As illustrated in FIG. 3, most of the through hole 41X is formed along the contour of the metal post 40. Thus, the through hole 41X has a tapered shape with a diameter that decreases from the lower surface 41B toward the upper surface 41A in the insulation layer 41. Further, the edge of the through hole 41X connected to the lower surface 41B of the insulation layer 41, that is, the open end of the through hole 41X is chamfered to have a round shape. An insulative resin such as epoxy resin may be used as the material of the insulation layer 41.

The cored solder ball 50 is bonded to the lower surface 40B of the metal post 40 exposed from the insulation layer 41, that is, the bottom surface of the recess 40X. Further, the cored solder ball 50 is bonded to the metal layer 21 on the connection pad P2. The cored solder ball 50 includes a spherical copper core ball 51 and solder 52 which encompasses the copper core ball 51. The solder 52 functions as a bonding material, and the copper core ball 51 functions as a spacer. That is, the solder 52 bonds the cored solder ball 50 to the metal layer 21 and the metal post 40. The copper core ball 51 may have a height (diameter) of, for example, approximately 50 to 100 μm. The cored solder ball 50 may have a height (diameter) of, for example, approximately 100 to 150 μm. In the spacer unit 6 of the present example, the ratio of the height of the metal post 40 to the height of the copper core ball 51 (or cored solder ball 50) is set to be 1:1. However, the ratio of the height of the metal post 40 to the height of the copper core ball 51 is not limited to 1:1, and the ratio may be set to 1:2 or 2:1. That is, one of the metal post 40 and the copper core ball 51 may be higher than or lower than the other one.

The operation of the electronic component incorporated substrate 1 will now be described.

Each spacer unit 6, electrically connecting the first substrate 2 and the second substrate 5, has a stacked structure of the metal post 40 and the cored solder ball 50 stacked in the stacking direction of the first substrate 2 and the second substrate 5. That is, the spacer unit 6 is formed by the stacked structure of two connection terminals (metal post 40 and cored solder ball 50). This allows for the diameter (that is, dimension in direction perpendicular to the stacking direction of substrates 2 and 5) of each connection terminal to be reduced in comparison with when the spacer unit 6 is formed with only one connection terminal (metal post or cored solder ball). A case in which the spacer units 6 hold the distance of 200 μm between the first substrate 2 and the second substrate 5 will now be described.

When the spacer unit 6 is formed by only one cored solder ball, the copper core ball has a diameter of 200 μm. In this case, the cored solder ball has a diameter of approximately 240 μm. When the interval between adjacent spacer units (cored solder balls) needs to be approximately 60 μm, the pitch between the spacer units (cored solder balls) is 300 (240+60) μm or greater. Further, when the spacer unit 6 is formed by only one metal post, and the metal post has an aspect ratio of 1, the metal post has a diameter (width) of 200 μm. In this case, the pitch between the spacer units (metal posts) is 260 (200+60) μm or greater. Here, an increase in the aspect ratio of the metal post to decrease the diameter (width) of the metal post advances side etching (etching of side wall of metal post) in the etching process. Thus, the manufacturing of the metal post becomes difficult. To avoid adverse effects of such side etching, the diameter of the metal post needs to be increased. However, an increase in the diameter of the metal post increases the pitch between spacer units (metal posts).

In contrast, in the first embodiment, the spacer units 6 may have a pitch of approximately 200 μm. In detail, when setting the ratio of the height of the metal post 40 to the height of the copper core ball 51 to 1:1 and setting the aspect ratio of the metal post 40 to 1, the height and diameter (width) of the metal post 40 is 100 μm, the diameter of the copper core ball 51 is 100 μm, and the diameter of the cored solder ball 50 is approximately 140 μm. When the interval between adjacent spacer units 6 needs to be approximately 60 μm, the pitch between the spacer units 6 may be approximately 200 (140+60) μm.

As described above, the dimension of each spacer unit 6 (that is, the dimension in direction perpendicular to the stacking direction of the substrates 2 and 5) may be reduced by forming each spacer unit 6 with the stacked structure of the metal post 40 and the cored solder ball 50 stacked in the stacking direction of the first substrate 2 and the second substrate 5. This allows for the minimum pitch to be narrowed in which the spacer units 6 are arranged.

With reference to FIGS. 4 to 11C, a method for manufacturing the electronic component incorporated substrate 1 will now be described. FIGS. 5A to 5D illustrate the cross-sectional structure in a metal plate manufacturing process taken along line A-A in FIG. 4. FIGS. 5E and 5F illustrate the cross-sectional structure in the metal plate manufacturing process taken along line B-B in FIG. 6A. FIGS. 7A to 7C illustrate the cross-sectional structure in a second substrate material manufacturing process taken along line C-C in FIG. 6B.

Figure 5A:
FIGS. 5A to 5F are schematic cross-sectional views illustrating the method for manufacturing the electronic component incorporated substrate of FIG. 1.

Referring to FIG. 4, a metal plate 60 is first prepared to form the metal posts 40. The metal plate 60 includes a plurality of (three in FIG. 4) regions A1. A plurality of metal posts 40 corresponding to a single electronic component incorporated substrate 1 are formed in each region A1. Referring to FIG. 5A, the metal plate 60 may have a thickness of approximately 150 to 250 µm. Copper or a copper alloy may be used as the material of the metal plate 60. To facilitate illustration, FIGS. 5A to 5F illustrate the cross-sectional structure of the metal plate 60 for a single region A1.

Figure 5B:
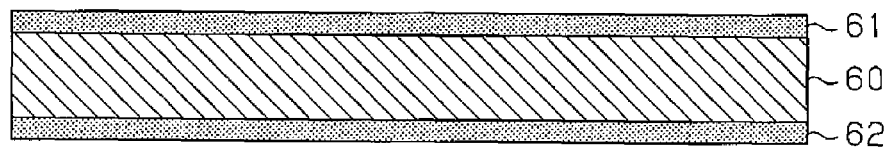
Figure 5C:
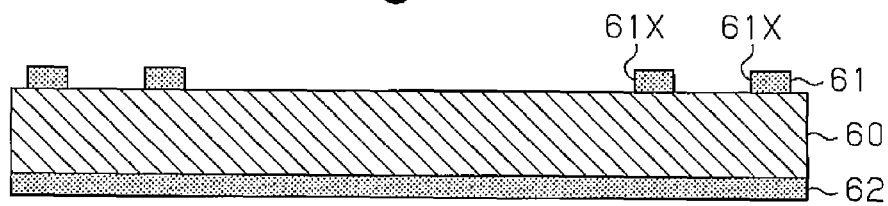

In the step illustrated in FIG. 5B, a resist layer 61 is formed to entirely cover the upper surface of the metal plate 60, and a resist layer 62 is formed to entirely cover the lower surface of the metal plate 60. In the step illustrated in FIG. 5C, openings 61X are formed in the resist layer 61 leaving the resist layer 61 at certain locations (locations where the metal posts 40 are formed). Taking into consideration the etching process performed in the next step, the materials of the resist layers 61 and 62 may be resistant to etching. For example, a photosensitive dry film resist or a liquid photoresist (e.g., dry film resist or liquid photoresist such as novolac resin or acrylic resin) may be used as the material of the resist layers 61 and 62. When using, for example, a photosensitive dry film resist, thermal compression bonding is performed to laminate the dry film on both of the upper and lower surfaces of the metal plate 60, and the dry film laminated on the upper surface of the metal plate 60 is exposed and developed. This patterns the dry film and forms the openings 61X. As a result, the resist layer 61 including the openings 61X is formed on the upper surface of the metal plate 60, and the resist layer 62 is formed entirely covering the lower surface of the metal plate 60. When using a liquid photoresist, the same step may be performed to form the resist layers 61 and 62.

Figure 5D:
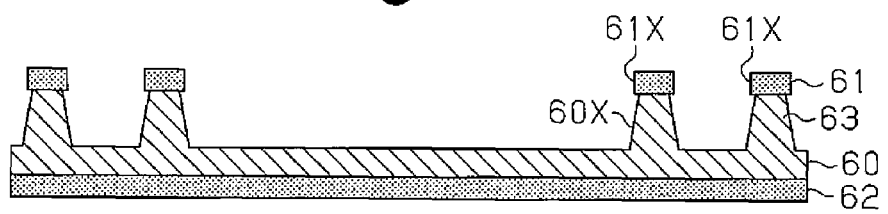

Then, in the step illustrated in FIG. 5D, half etching is performed using the resist layers 61 and 62 as etching masks to thin the metal plate 60 exposed from the openings 61X to a certain depth. This forms recesses 60X in portions of the metal plate 60 exposed from the openings 61X. In other words, portions of the metal plate 60 covered by the resist layer 61 form projections 63. For example, when patterning the metal plate 60 through wet etching (isotropic etching), the etching liquid used for the wet etching may be selected in accordance with the material of the metal plate 60. For example, when using copper as the metal plate 60, aqueous ferric chloride may be used as the etching liquid. In this case, spray etching may be performed from the upper surface side of the metal plate 60 to form the recesses 60X. In this manner, when the recesses 60X are formed in the metal plate 60 by performing wet etching, a side etching effect occurs and advances etching in the planar direction of the metal plate 60. This forms the projections 63 with a trapezoidal cross-section. Such an etching process (half etching) allows for the formation of the recesses 60X (projections 63). However, a stamping process may be performed to form the recesses 60X (projections 63).

Figure 5E:

In the step illustrated in FIG. 5E, the resist layers 61 and 62 illustrated in FIG. 5D are removed with an alkali defoliation liquid. This arranges the projections 63 in two lines along the peripheral edge (illustrated by broken lines) of the region A1 as illustrated in FIG. 6A.

Figure 5F:

In the step illustrated in FIG. 5F, a solder 64 (first solder) is formed on an upper surface 63A (first surface) of each projection 63. The solder 64 may be formed by applying a solder paste or mounting a solder ball.

Referring to FIG. 6B, a second substrate material 65 (hereinafter, simply referred to as the substrate material 65) for forming the second substrate 5 is prepared. The substrate material 65 is a single material used to form a plurality of the second substrates 5. The substrate material 65 includes a plurality of (three in this case) substrate formation regions A2. The second substrate 5 is formed in each substrate formation region A2. The substrate material 65 is larger than the metal plate 60. FIG. 6B illustrates a structure corresponding to the second substrate 5 in each substrate formation region A2, that is, a situation in which many connection pads P5 are formed on the lower side of each substrate formation region A2. The substrate material 65 is cut along cutting lines B2 in a subsequent step by a dicing blade or the like. This singulates structures, each corresponding to the second substrate 5. The structure corresponding to the second substrate 5 may be manufactured through a known method, which will now be described with reference to FIG. 7A. FIGS. 7A to 7C and FIGS. 9A to 9D illustrate the cross-sectional structure of the substrate material 65 at only one substrate formation region A2 to facilitate description.

First, the through holes 31X are formed at certain locations in the substrate core 31. Then, a plating is applied to the wall surfaces of the through holes 31X to form the through electrodes 32. This forms an electrically conductive path between the upper and lower surfaces of the substrate core 31. Then, a subtractive process, for example, is performed to form the wiring patterns 33 and 36. Next, the solder resist layer 35 is formed including the openings 35X that expose portions of the wiring pattern 33 as the component connection pads P4. Further, the solder resist layer 38 is formed including the openings 38X that expose portions of the wiring pattern 36 as the connection pads P5. Then, electroless plating is performed to form the metal layer 34 on the component connection pads P4. In this manner, a structure corresponding to the second substrate 5 is formed in each substrate formation region A2 of the substrate material 65.

Figure 7A:
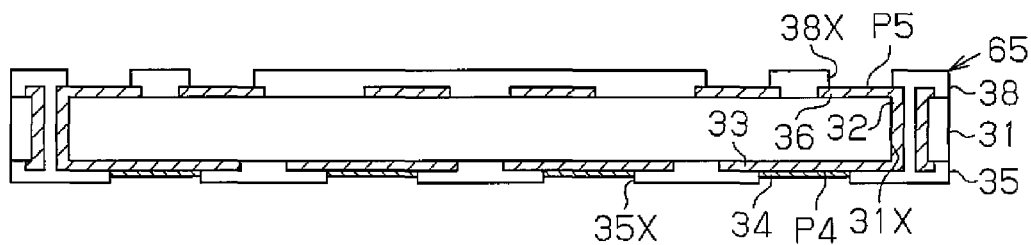
FIGS. 7A to 7C are schematic cross-sectional views illustrating the method for manufacturing the electronic component incorporated substrate of FIG. 1.
Figure 7B:
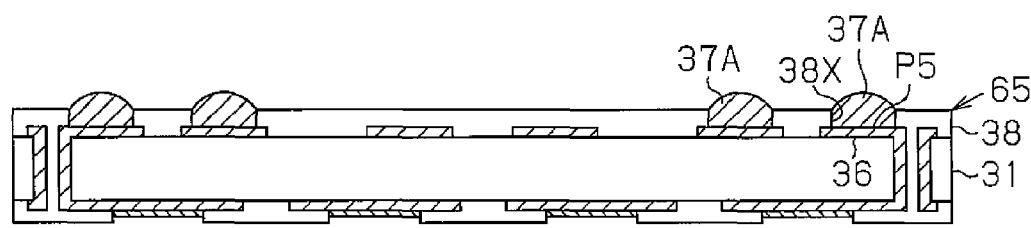

In the step illustrated in FIG. 7B, solder 37A (second solder) is formed on each connection pad P5. The solder 37A may be formed by applying a solder paste or by mounting a solder ball.

Figure 7C:
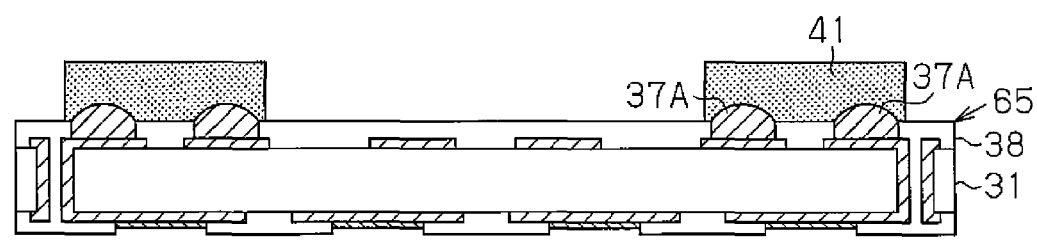
Figure 8:
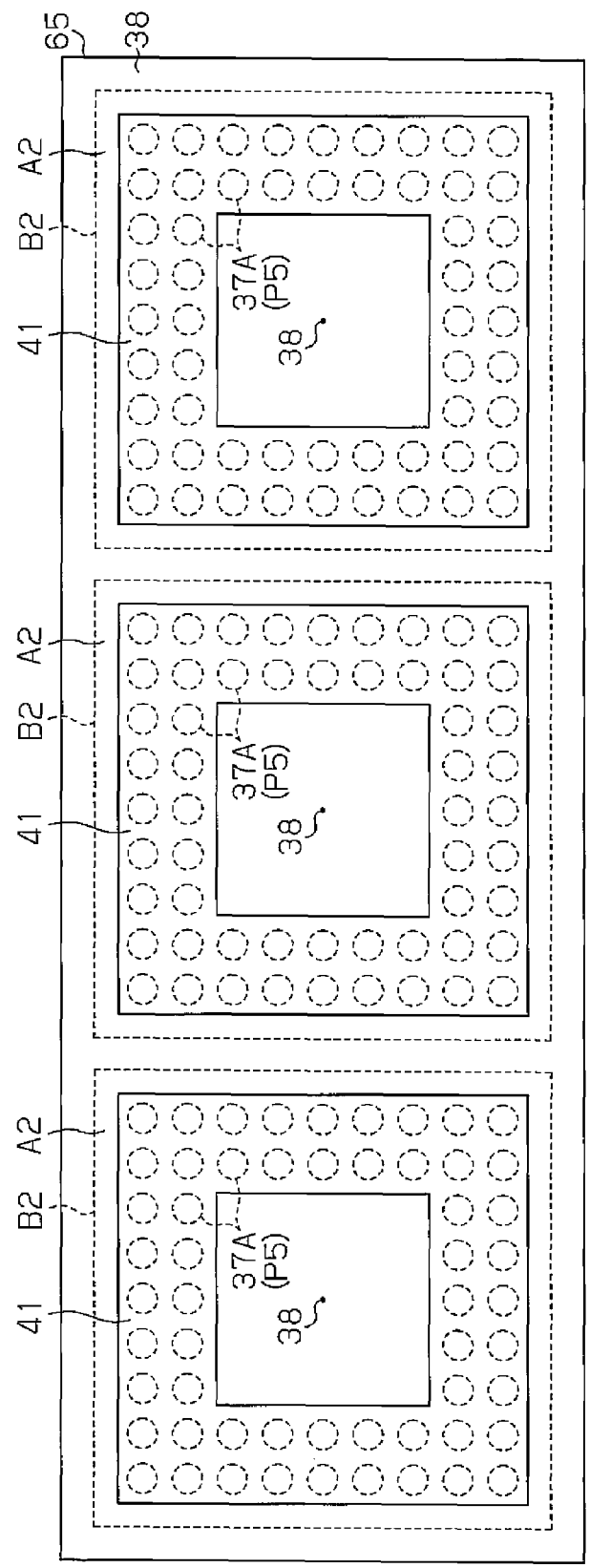
FIG. 8 is a schematic plan view illustrating the method for manufacturing the electronic component incorporated substrate of FIG. 1.

In the step illustrated in FIG. 7C, the insulation layer 41 is formed on the solder resist layer 38 to cover the solder 37A (connection pads P5). Referring to FIG. 8, the insulation layer 41 is frame-shaped to cover each solder 37A in each substrate formation region A2. An adhesive sheet of a B-stage (semi-cured state) insulative resin, such as a non-conductive film (NCF), or an adhesive paste of an insulative resin, such as a non-conductive paste (NCP), may be used as the material of the insulation layer 41. Other materials that may be used for the insulation layer 41 include a buildup resin, such as an epoxy resin including an inorganic filler or an epoxy resin that does not include an inorganic filler, and a liquid crystal polymer. Another material that may be used for the insulation layer 41 may be an adhesive sheet of an anisotropic conductive resin, such as an anisotropic conductive film (ACF), or an adhesive paste of an anisotropic conductive resin, such as an anisotropic conducive paste (ACP). The ACP and ACF include small-diameter resin pellets, which are Ni/Au-coated, dispersed in an insulative resin including an epoxy resin or a cyanate ester resin as a base. This material is conductive in a vertical direction and insulative in the horizontal direction. Such a resin material of the insulation layer 41 may be, for example, a thermosetting resin.

When using an adhesive sheet of an insulative resin or anisotropic conductive resin as the insulation layer 41, a sheet of insulative resin formed in the shape of a frame as viewed from above may be laminated on the solder resist layer 38 to form the insulation layer 41. In this state, the sheet of insulative resin is not thermally cured and left in the B-stage state. By laminating the sheet of insulative resin in a vacuum atmosphere, the formation of voids in the insulation layer 41 may be suppressed. When using a paste of insulative resin or anisotropic conductive resin as the insulation layer 41, screen printing is performed to form a liquid or paste of insulative resin or anisotropic conductive resin on the solder resist layer 38. Then, prebaking is performed to semi-cure the insulative resin or anisotropic conductive resin. The semi-cured insulative resin or anisotropic conductive resin is adhesive.

Figure 9A:
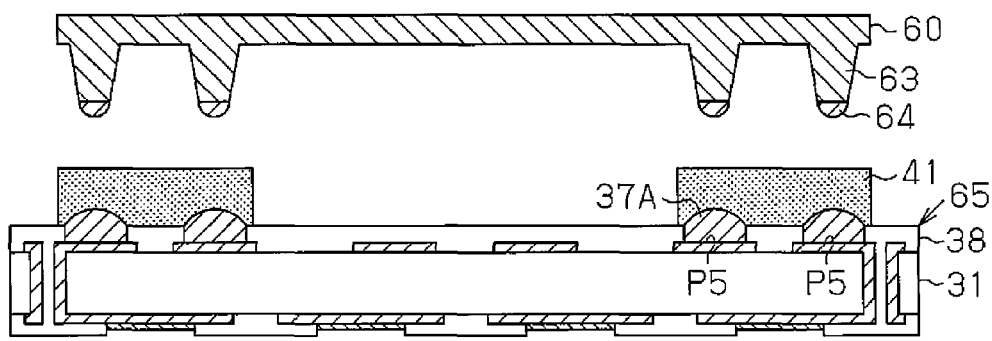
FIGS. 9A to 9D are schematic cross-sectional views illustrating the method for manufacturing the electronic component incorporated substrate of FIG. 1.

In the step illustrated in FIG. 9A, the metal plate 60 including the projections 63 is arranged above the substrate material 65 including the insulation layer 41. Here, the metal plate 60 and the substrate material 65 are positioned so that the three regions A1 of the metal plate 60 are vertically aligned with the three substrate formation regions A2 of the substrate material 65. More specifically, the metal plate 60 and the substrate material 65 are positioned so that the solder 37A (connection pads P5) exposed from the solder resist layer 38 of the substrate material 65 is opposed to the projections 63 (solder 64) of the metal plate 60.

Figure 9B:
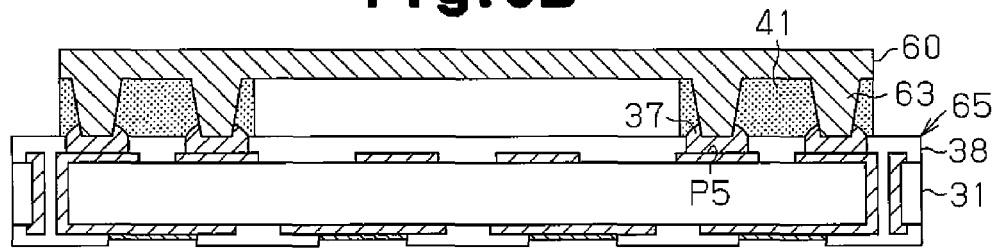

In the step illustrated in FIG. 9B, the projections 63 of the metal plate 60 are bonded to the solder 37A on the connection pads P5. The adhesion of the insulation layer 41 that is in the B-stage state and not thermally cured is used to tentatively fix the metal plate 60 to the substrate material 65 through the insulation layer 41. If necessary, the metal plate 60 may be forced toward the insulation layer 41 (substrate material 65). Here, the projections 63 of the metal plate 60 are arranged at positions corresponding to the solder 37A of the substrate material 65. Then, the projections 63 are electrically connected to the solder 37 by, for example, raising the temperature to approximately 230° C. to 260° C. and applying a load from above to the metal plate 60. The projections 63 of the metal plate 60 and solder 64 pierce the semi-cured insulation layer 41 and connect to the solder 37A. Here, the heating process described above melts the solder 64 and the solder 37A into an alloy and forms a single solder layer 37. As a result, the solder layer 37 electrically connects the projections 63 and the connection pads P5. In this manner, by heating the solders 64 and 37A to approximately 230° C. to 260° C. to melt and solidify the solders 64 and 37A, the projections 63 are electrically connected to the connection pads P5. When using ACF or ACP as the insulation layer 41, pressure is applied to the insulation layer 41 (ACF or ACP) between the projections 63 (solder 64) and the solder 37A so that the insulation layer 41 obtains conductivity in the thickness-wise direction. This electrically connects the solder 64 and the solder 37A, and electrically connects the projections 63 and the connection pads P5 through the solders 64 and 37A.

By applying a load from above to the metal plate 60 as described above, the semi-cured insulation layer 41 is widened in a planar direction perpendicular to the stacking direction of the metal plate 60 and the substrate material 65. When or after stacking the metal plate 60, a heating process is performed on the semi-cured insulation layer 41. This heats the insulation layer 41 to a curing temperature or higher for a given time and thermally cures the insulation layer 41. Further, the thermally cured insulation layer 41 covers the projections 63.

Figure 9C:
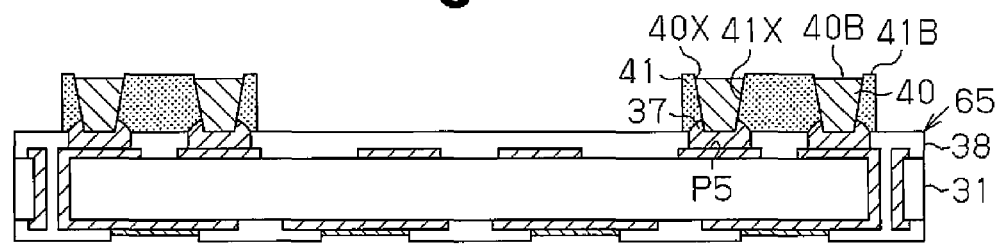

Next, referring to FIG. 9C, half etching is performed to thin the metal plate 60 by a certain depth and form the metal posts 40. Here, the metal plate 60 is thinned until a portion of the lower surface of each projection 63 (second surface, upper side of the projection 63 as viewed in FIG. 9B) is removed, that is, until the lower surface 40B of each metal post 40 illustrated in FIG. 9C becomes lower than the lower surface 41B of the insulation layer 41. This forms the metal posts 40 in the through holes 41X of the insulation layer 41 and forms a step between the lower surface 40B of each metal post 40 and the lower surface 41B of the insulation layer 41. Further, by thinning the metal plate 60 so that the lower surface 40B of each metal post 40 becomes lower than the lower surface 41B of the insulation layer 41, the recess 40X, which has a bowl-shaped cross-section, is formed in the lower surface 40B of the metal post 40, and the edges of the through hole 41X are chamfered into a round shape. That is, as the thinning of the metal plate 60 advances and exposes the insulation layer 41, the etching rate of the metal plate 60 in the proximity of the insulation layer 41 becomes lower than the etching rate of the metal plate 60 at a location distant from the insulation layer 41. Consequently, the recess 40X is formed with an oblique side wall in the lower surface 40B of each metal post 40. Further, the etching process eliminates edges of the insulation layer 41 at the open end of each through hole 41X. This chamfers the open end of the through hole 41X. In this manner, the etching process thins the metal plate 60 until the recess 40X is formed in the lower surface 40B of each metal post 40 and the open end of the through hole 41X is chamfered.

For example, when performing wet etching (isotropic etching) to thin the metal plate 60, the etching liquid used for the wet etching may be selected in accordance with the material of the metal plate 60. For example, when using copper as the metal plate 60, aqueous ferric chloride may be used as the etching liquid. In this case, spray etching may be performed from the upper surface side of the metal plate 60 to form the metal posts 40. In this step, the insulation layer 41 functions as a protective layer that protects the projections 63 (metal posts 40) so that the side surfaces of the projections 63 are not removed by the etching.

Figure 9D:
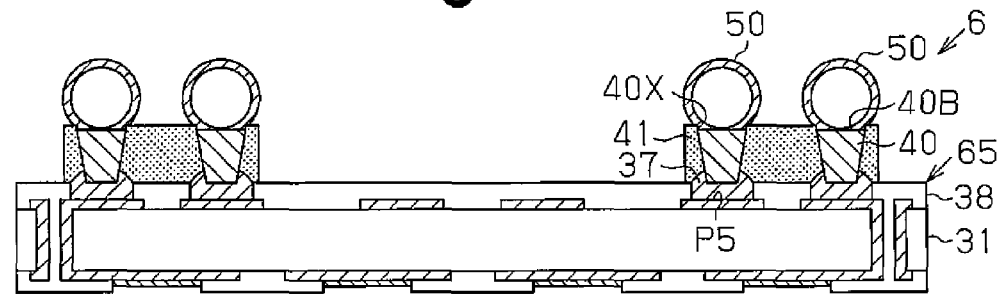

In the step illustrated in FIG. 9D, the cored solder ball 50 is mounted on the lower surface 40B of each metal post 40 that becomes a pad. The cored solder ball 50 may be mounted after applying flux to the lower surface 40B of each metal post 40. Then, a reflow process is performed at a temperature of approximately 230° C. to 260° C. to fix the cored solder ball 50 to the lower surface 40B of the metal post 40. Then, the surface is washed to remove the flux.

The steps illustrated in FIGS. 5A to 9D bond each spacer unit 6 that includes the metal post 40, the cored solder ball 50, and the insulation layer 41.

Figure 11A:
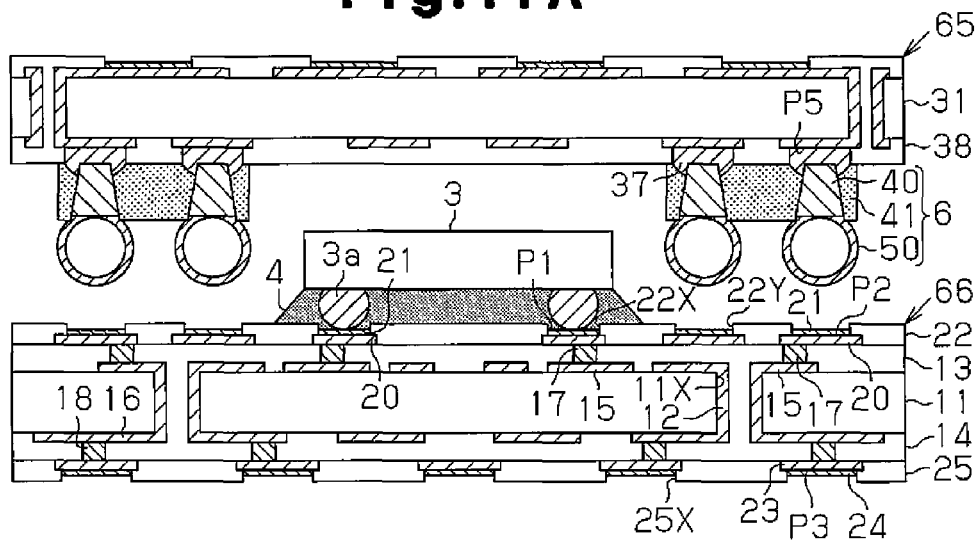
FIGS. 11A to 11C are schematic cross-sectional views illustrating the method for manufacturing the electronic component incorporated substrate of FIG. 1.
Figure 11B:
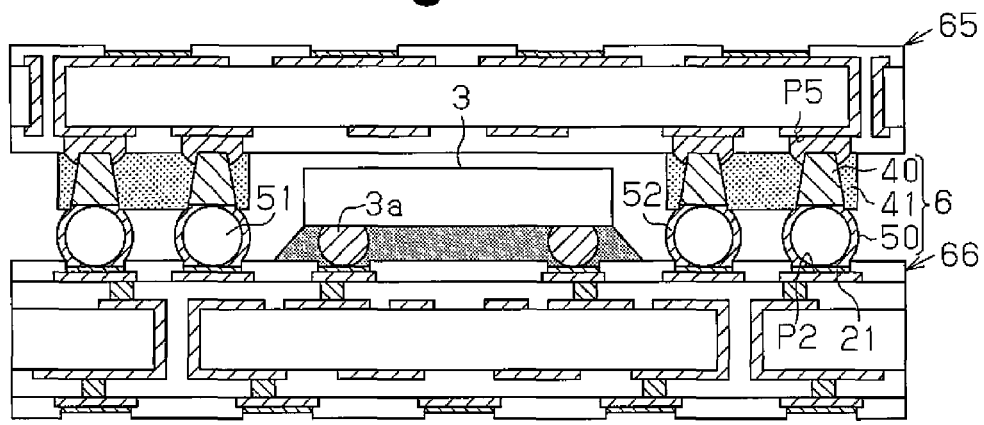
Figure 11C:
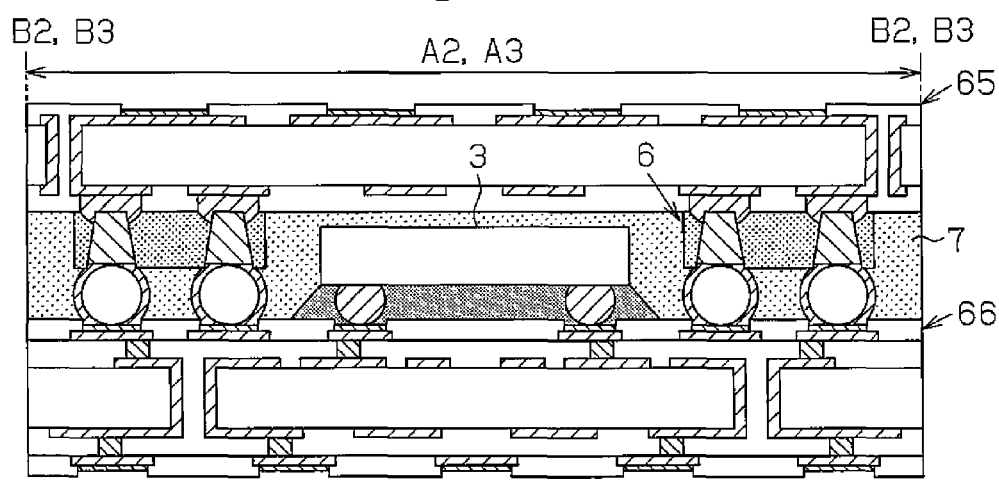

Next, referring to FIG. 10, a first substrate material 66 (hereinafter, simply referred to as the substrate material 66) for forming the first substrate 2 is prepared. The substrate material 66 is a single material used to form a plurality of the first substrates 2. The substrate material 66 includes a plurality of (three in this case) substrate formation regions A3. The first substrate 2 is formed in each substrate formation region A3. FIG. 10 illustrates a structure corresponding to the first substrate 2 in each substrate formation region A3, that is, a situation in which many connection pads P2 and the metal layer 21 are formed on the upper side of each substrate formation region A3. Further, the semiconductor chip 3 is mounted on the upper surface of each substrate formation region A3. The substrate material 66 is cut along cutting lines B3 in a subsequent step by a dicing blade or the like. This singulates structures, each corresponding to the first substrate 2. The structure corresponding to the first substrate 2 may be manufactured through a known method, which will now be described with reference to FIG. 11A. FIGS. 11A to 11C illustrate the cross-sectional structure of the substrate material 66 at only one substrate formation region A3 to facilitate description.

First, the through holes 11X are formed at certain locations in the substrate core 11. Then, a plating is applied to the wall surfaces of the through holes 11X to form the through electrodes 12. This forms an electrically conductive path between the upper and lower surfaces of the substrate core 11. Then, a subtractive process, for example, is performed to form the wires 15 and 16. Further, a resin film vacuum-laminated to the upper and lower surfaces of the substrate core 11 is heated and cured to form the insulation layers 13 and 14. The insulation layers 13 and 14 may be formed by applying and heating a paste or liquid of resin. Then, openings are formed in the insulation layers 13 and 14. If necessary, a desmearing process is performed. Then, a semi-additive process, for example, is performed to form the vias 17 and 18 and the wiring patterns 20 and 23. Next, the solder resist layer 22 is formed including the openings 22X and 22Y that expose portions of the wiring pattern 20 as the chip pads P1 and the connection pads P2. Further, the solder resist layer 25 is formed including the openings 25X that expose portions of the wiring pattern 23 as the external connection pads P3. Then, electroless plating is performed to form the metal layer 21 on the chip pads P1 and the connection pads P2 and form the metal layer 24 on the external connection pads P3. Then, the bumps 3a of the semiconductor chip 3 are flip-chip bonded to the metal layer 21 on the chip pads P1. That is, the semiconductor chip 3 is flip-chip mounted on the substrate formation region A3 of the substrate material 66. Subsequently, the underfill resin 4 is filled between the semiconductor chip 3 and the solder resist layer 22. In this manner, a structure corresponding to the first substrate 2 is formed in each substrate formation region A3 of the substrate material 66.

In the step illustrated in FIG. 11A, the second substrate material 65, which is bonded to the spacer units 6, is arranged above the first substrate material 66. The two substrate materials 65 and 66 are positioned to vertically align the three substrate formation regions A3 of the first substrate material 66 with the three substrate formation regions A2 of the second substrate material 65. More specifically, the two substrate materials 65 and 66 are positioned so that the upper surface of the solder resist layer 22 on the first substrate material 66 opposes the lower surface of the solder resist layer 38 on the second substrate material 65, and so that the spacer units 6 (connection pads P5) oppose the metal layer 21 (connection pads P2).

In the step illustrated in FIG. 11B, the cored solder ball 50 of each spacer unit 6 is bonded to the metal layer 21 on the corresponding connection pad P2. For example, after applying flux to the upper surface of the metal layer 21, the second substrate material 65 is arranged on the first substrate material 66 with the spacer units 6 held in between. The spacer units 6 form a gap (space) between the first substrate material 66 and the second substrate material 65. Thus, the semiconductor chip 3 mounted on the substrate formation region A3 of the first substrate material 66 is accommodated in the gap. The substrate material 66 and the substrate material 65, which are stacked together as described above, are heated to a temperature of approximately 230° to 260° C. in a reflow furnace. This melts the solder 52 of the cored solder ball 50, and bonds the solder ball 50 to the metal layer 21 on the connection pad P2. In this manner, the second substrate material 65 is fixed to the first substrate material 66. In this step, when the reflow process is performed while forcing the second substrate material 65 against the first substrate material 66, the copper core ball 51 of the cored solder ball 50 and the metal post 40 function as a spacer. This maintains a given distance between the two substrate materials 65 and 66.

In the step illustrated in FIG. 11C, the encapsulating resin 7 is formed to fill the space between the two substrate materials 65 and 66 and encapsulates the semiconductor chip 3 and the like arranged between the two substrate materials 65 and 66. For example, when using a thermosetting molding resin as the material of the encapsulating resin 7, the structure illustrated in FIG. 11B is arranged in a molding die, pressure (e.g., 5 to 10 MPa) is applied to the interior of the molding die, and a flux of the molding resin is charged into the molding die. Then, the resin is heated to, for example, approximately 180° C. and cured to form the encapsulating resin 7. The encapsulating resin 7 rigidly fixes the substrate material 65 and the substrate material 66.

The above manufacturing steps manufacture the structure corresponding to the electronic component incorporated substrate 1 in the substrate formation regions A2 and A3 of the substrate materials 65 and 66.

The structure illustrated in FIG. 11C is diced and cut along the cutting lines B2 of the substrate material 65 and the cutting lines B3 of the substrate material 66 to singulate three electronic component incorporated substrates 1. The above manufacturing steps simultaneously manufacture three electronic component incorporated substrates 1. The number of simultaneously manufactured electronic component incorporated substrates 1 is not limited to three. By changing the size of the first and second substrates 2 and 5, any number of electronic component incorporated substrates 1 may be simultaneously manufactured.

The first embodiment has the advantages described below.

(1) Each spacer unit 6, which electrically connects the first substrate 2 and the second substrate 5, includes a stacked structure of the metal post 40 and the cored solder ball 50. This allows for the minimum pitch of the spacer units 6 to be narrowed. Thus, the pitch of the connection pads P2 and P5 may easily be narrowed when the wiring patterns 20 and 36 and the like are miniaturized. In other words, even when increasing the height of the semiconductor chip 3 arranged between the first substrate 2 and the second substrate 5, the pitch of the connection pads P2 and P5 may easily be narrowed.

(2) The recess 40X, which has a bowl-shaped cross-section, is formed in the lower surface 40B of each metal post 40, and the cored solder ball 50 is mounted in the recess 40X. A step is formed by the bottom surface of the recess 40X and the lower surface 41B of the insulation layer 41. Thus, the recess 40X allows for easy mounting of the cored solder ball 50 to the recess 40X (lower surface 40B of the metal post 40). Further, the step suppresses the leakage of solder (e.g., solder 52) to the adjacent connection pad P5. This maintains the height of the solder 52.

(3) The lower surface 40B of the metal post 40 is recessed from the lower surface 41B of the insulation layer 41, which covers the side wall of the metal post 40, toward the upper surface 40A (opposite surface). The cored solder ball 50 is arranged on the lower surface 40B of the metal post 40. In this manner, a step is formed by the lower surface 40B of the metal post 40 and the lower surface 41B of the insulation layer 41. This facilitates the mounting of the cored solder ball 50 to the lower surface 40B of the metal post 40.

(4) The edge of the through hole 41X located toward the lower surface 40B of the metal post 40, that is, the open end of the through hole 41X, is chamfered. Thus, when the cored solder ball 50 is mounted on the lower surface 40B of the corresponding metal post 40, that is, when mounting the solder ball 50 in the through hole 41X of the insulation layer 41, the cored solder ball 50 is easily arranged in the through hole 41X even when a slight displacement occurs.

(5) A metal post, which is a rod-shaped connection terminal, may be formed in the following manner. A barrier metal layer is formed on each connection pad P5, a pad (barrier metal layer) is exposed, a plating resist is patterned, and a rod-shaped connection terminal is then formed by performing a plating (e.g., electrolytic copper plating) on the barrier metal layer. Then, the plating resist is removed, and the exposed barrier metal layer is etched. Such a manufacturing method may form metal posts. However, when forming metal posts through plating, variations easily occur in the plating thickness. Thus, when tall metal posts are formed, variations in the height of the metal post increases.

In contrast, in the first embodiment, the metal plate 60 is etched to form the metal posts 40. Thus, in comparison to when forming metal posts through plating, variations may be reduced in the height of the metal posts 40. This improves the connectivity of the first substrate 2 and the second substrate 5.

A second embodiment will now be described with reference to FIGS. 12 to 15C. An electronic component incorporated substrate 1A of the second embodiment differs from the first embodiment in the structure of the spacer unit. The following description will center on the differences from the first embodiment. Like or same reference numerals are given to those components that are the same as the corresponding components of the first embodiment. Such components will not be described in detail.

Referring to FIG. 12, a metal layer 39 is formed on each connection pad P5 of the second substrate 5. For example, the metal layer 39 may be formed by sequentially stacking an Ni layer and an Au layer from the lower surface of the wiring pattern 36. The metal layer 39 may also be formed by sequentially stacking an Ni layer, a Pd layer, and an Au layer from the lower surface of the wiring pattern 36. Alternatively, the metal layer 39 may be formed by sequentially stacking an Ni layer, a Pd layer, and an Ag layer from the lower surface of the wiring pattern 36 or by sequentially stacking an Ni layer, a Pd layer, an Ag layer, and an Au layer from the lower surface of the wiring pattern 36. When the metal layer 39 is formed by an Ni layer and an Au layer, the Ni layer may have a thickness of approximately 0.05 to 5 µm, and the Au layer may have a thickness of approximately 0.01 to 1 µm. When the metal layer 39 covers the connection pad P5, the metal layer 39 functions as a connection pad.

A spacer unit 6A is bonded to each metal layer 39. The spacer unit 6 is also bonded to the corresponding connection pad P2 (metal layer 21) of the first substrate 2. In other words, each spacer unit 6A is arranged between the first substrate 2 and the second substrate 5. Further, each spacer unit 6A includes one end bonded to the metal layer 39 and another end bonded to the metal layer 21. The spacer units 6A have a height set to be greater that the total thickness of the semiconductor chip 3 and the bumps 3a. The spacer units 6A may have a thickness of, for example, 150 to 300 µm.

Each spacer unit 6A includes a cored solder ball 42, a metal post 40 bonded to the cored solder ball 42, an insulation layer 46 covering the cored solder ball 42 and the side wall of the metal post, and a cored solder ball 50 mounted on the lower surface 40B of the metal post 40 exposed from the insulation layer 46. In this manner, the spacer unit 6A of the present example includes a stacked structure of the cored solder ball 42 (second solder ball), the metal post 40, and the cored solder ball 50 (first solder ball) that are stacked in the stacking direction of the first substrate 2 and the second substrate 5.

The cored solder ball 42 is bonded to the metal layer 39 in the corresponding connection pad P5. Accordingly, the metal layer 39 electrically connects the cored solder ball 42 to the connection pad P5. Further, the cored solder ball 42 includes a spherical copper core ball 43 and solder 44 which encompasses the copper core ball 43. The solder 44 functions as a bonding material, and the copper core ball 43 functions as a spacer. In this manner, the solder 44 bonds the cored solder ball 42 to the metal layer 39 and the metal post 40. The copper core ball 43 may have a height (diameter) of approximately 50 to 100 µm. The cored solder ball 42 may have a height (diameter) of approximately 100 to 150 µm.

The upper surface 40A of the metal post 40 is bonded to the cored solder ball 42, and the lower surface 40B of the metal post 40 is bonded to the cored solder ball 50. The metal post 40 may have a height of approximately 50 to 100 µm.

The insulation layer 46 is formed on the lower surface of the solder resist layer 38 to entirely cover each cored solder ball 42 and cover the side wall of each metal post 40. Through holes 46X extend through the insulation layer 46 in a thickness-wise direction at certain locations where the cored solder balls 42 and the metal posts 40 are formed. Each through hole 46X accommodates the corresponding cored solder ball 42 and metal post 40. In the same manner as the insulation layer 41 (FIG. 2), the insulation layer 46 may be frame-shaped as viewed from above to surround the peripheral edge of the semiconductor chip 3. The through holes 46X of the insulation layer 46 are arranged in lines (here, two lines) along the peripheral edge of the semiconductor chip 3 as viewed from above. An insulative resin such as an epoxy resin may be used as the material of the insulation layer 46.

Each cored solder ball 50 is bonded to the lower surface 40B of the corresponding metal post 40 exposed from the insulation layer 46. Further, the cored solder ball 50 is bonded to the metal layer 21 on the corresponding connection pad P2. The copper core ball 51 may have a height (diameter) of, for example, approximately 50 to 100 µm. The cored solder ball 50 may have a height (diameter) of, for example, approximately 100 to 150 µm.

In the spacer unit 6A of the present example, the ratio of the height of the copper core ball 43 (or cored solder ball 42) to the height of the metal post 40 to the height of the copper core ball 51 (or cored solder ball 50) is set to be 1:1:1. However, the ratio is not limited to 1:1:1.

A method for manufacturing the electronic component incorporated substrate 1A will now be described. In the description hereafter, an enlarged view of a single electronic component incorporated substrate 1A is illustrated in the drawings to facilitate illustration. Actually, in the same manner as first embodiment, structures corresponding to a plurality of electronic component incorporated substrates 1A are simultaneously formed and then each electronic component incorporated substrate 1A is singulated. The singulation process will not be described below.

Figure 13A:
FIGS. 13A and 13B, 14A to 14D, and 15A to 15C are schematic cross-sectional views illustrating a method for manufacturing the electronic component incorporated substrate of FIG. 12.

In the step illustrated in FIG. 13A, the projections 63 are formed at certain locations in the metal plate 60 through the same manufacturing steps as those illustrated in FIGS. 5A to 5E.

Figure 13B:
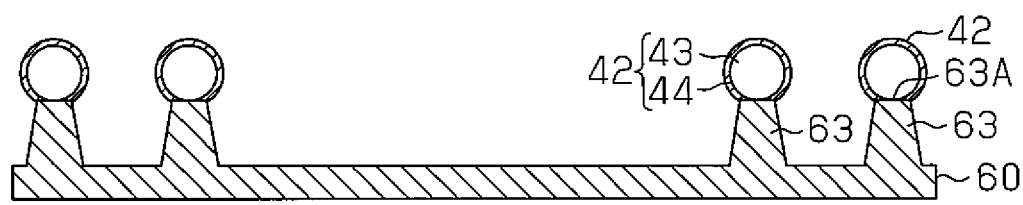

Then, in the step illustrated in FIG. 13B, the cored solder balls 42 are mounted on the upper surfaces 63A of the projections 63. For example, each cored solder ball 42 is mounted on the upper surface 63A of the corresponding projection 63 after applying flux. Then, a reflow process is performed at a temperature of approximately 230° C. to 260° C. to fix the cored solder ball 42 to the upper surface 63A of the projection 63. Then, the surface is washed to remove the flux.

Figure 14A:
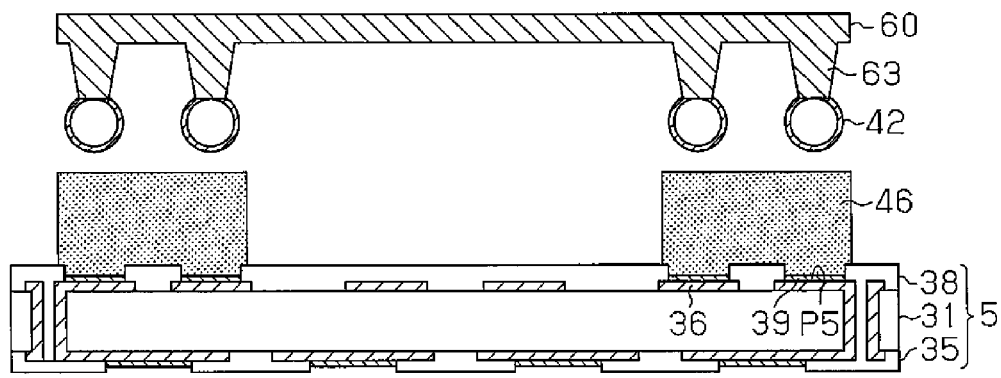

In the step illustrated in FIG. 14A, a metal layer 39 is formed on the connection pads P5 of the second substrate 5 through, for example, an electroless plating process. Then, an insulation layer 46 in the B-stage state is formed on the solder resist layer 38 to cover the metal layer 39 (connection pads P5). The same material as the insulation layer 41 may be used as the material of the insulation layer 46.

In the step illustrated in FIG. 14A, the metal plate 60 including the cored solder balls 42 on the projections 63 is arranged above the second substrate 5 including the insulation layer 46. The metal plate 60 and the second substrate 5 are positioned so that the metal layer 39 (connection pads P5) formed on the solder resist layer 38 of the second substrate 5 are opposed to the cored solder balls 42 (projections 63) of the metal plate 60.

Figure 14B:
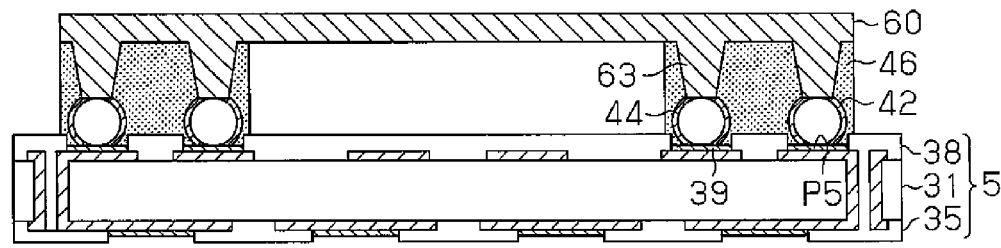

Then, in the step illustrated in FIG. 14B, the cored solder balls 42 are bonded to the metal layer 39 on the connection pads P5. The adhesion of the insulation layer 46 that is in the B-stage state and not thermally cured is used to tentatively fix the metal plate 60 to the second substrate 5 through the insulation layer 46. If necessary, the metal plate 60 may be forced toward the insulation layer 46 (second substrate 5). Here, the cored solder balls 42 mounted on the projections 63 of the metal plate 60 are arranged at positions corresponding to the metal layer 39 of the second substrate 5. This structure is heated to a temperature of approximately 230° C. to 260° C., and a load may be applied from above to the metal plate 60. As a result, the projections 63 of the metal plate 60 and the cored solder ball 42 pierce the semi-cured insulation layer 46 and connect to the metal layer 39. This electrically connects the cored solder ball 42 and the metal layer 39. Here, the solder 44 on the cored solder ball 42 melts and then hardens. This electrically connects the cored solder ball 42 and the metal layer 39.

By applying a load from above to the metal plate 60 as described above, the semi-cured insulation layer 46 is widened in a planar direction perpendicular to the stacking direction of the metal plate 60 and the second substrate 5. When or after stacking the metal plate 60, a heating process is performed on the semi-cured insulation layer 46. This heats the insulation layer 46 to a curing temperature or higher for a given time and thermally cures the insulation layer 46. As a result, the thermally cured insulation layer 46 is adhered to the metal plate 60. Further, the thermally cured insulation layer 46 covers the projections 63 and the cored solder ball 42.

Figure 14C:
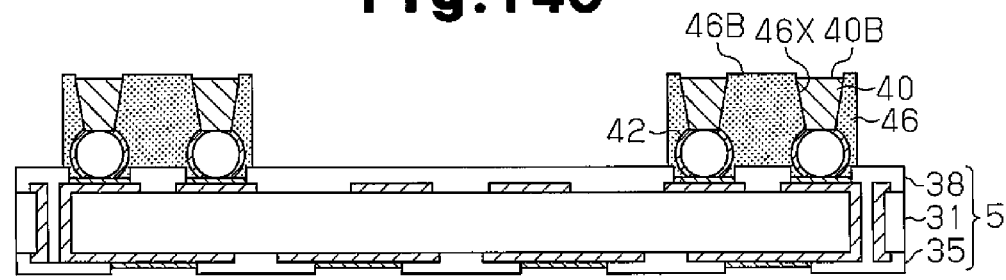

Next, in the same manner as the step illustrated in FIG. 9C, half etching is performed to thin the metal plate 60 by a certain depth. This forms the metal posts 40 in the through holes 46X of the insulation layer 46 as illustrated in FIG. 14C. Further, steps are formed by the lower surfaces 40B of the metal posts 40 and the lower surface 46B of the insulation layer 46.

Figure 14D:
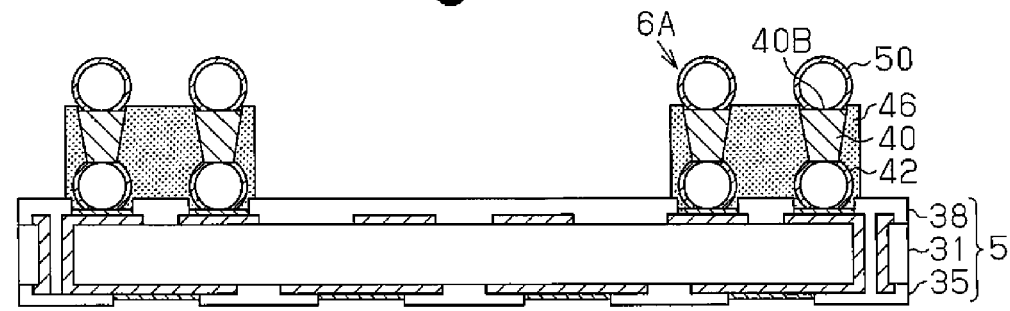

In the step illustrated in FIG. 14D, the cored solder balls 50 are mounted on the lower surfaces 40B of the metal posts 40. For example, the cored solder balls 50 are mounted on the lower surfaces 40B of the metal posts 40 after applying flux. Then, a reflow process is performed at a temperature of approximately 230° C. to 260° C. to fix the cored solder balls 50 to the lower surfaces 40B of the metal posts 40. This forms the spacer units 6A on the second substrate 5. Each spacer unit 6A includes the cored solder ball 42, the metal post 40, the cored solder ball 50, and the insulation layer 46.

Figure 15A:
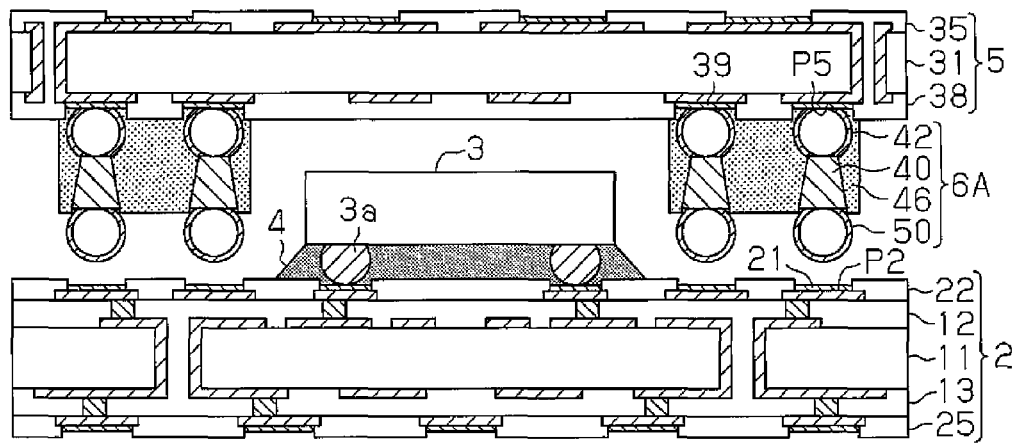

In the step illustrated in FIG. 15A, the second substrate 5, which is bonded with the spacer units 6A, is arranged above the first substrate 2. Here, the first and second substrates 2 and 5 are positioned so that the metal layer 21 (connection pads P2) exposed from the upper surface of the solder resist layer 22 on the first substrate 2 opposes the spacer units 6A (connection pads P5) arranged on the lower surface of the solder resist layer 38 on the second substrate 5.

Figure 15B:
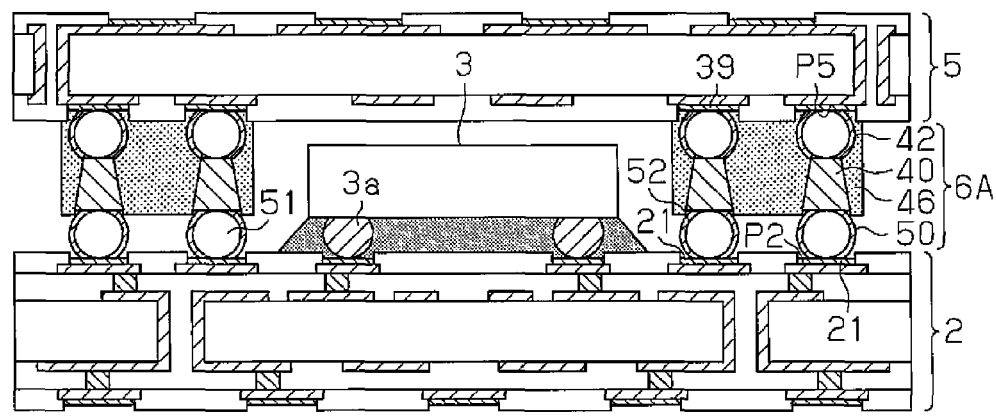

In the step illustrated in FIG. 15B, in the same manner as the step illustrated in FIG. 11B, the cored solder ball 50 of each spacer unit 6A is bonded to the metal layer 21 on the corresponding connection pad P2. For example, after applying flux to the metal layer 21 on the connection pads P2, the second substrate 5 is stacked on the first substrate 2 with the spacer units 6A held in between. Then, the first and second substrates 2 and 5 are heated to a temperature of approximately 230° C. to 260° C. in a reflow furnace. This melts the solder 52 of each cored solder ball 50 and bonds the cored solder ball 50 to the metal layer 21 on the corresponding connection pad P2. In this manner, the second substrate 5 is fixed to the first substrate 2.

Figure 15C:
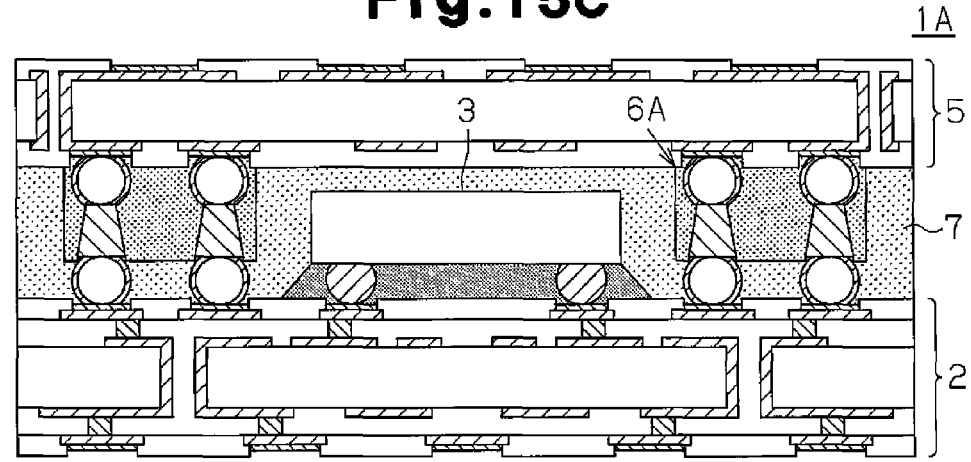

In the step illustrated in FIG. 15C, in the same manner as the step illustrated in FIG. 11C, the encapsulating resin 7 is formed to fill the gap or space between the first substrate 2 and the second substrate 5 and encapsulate the semiconductor chip 3 and the like arranged between the first substrate 2 and the second substrate 5. The encapsulating resin 7 rigidly fixes the first substrate 2 and the second substrate 5 to each other. In this manner, the electronic component incorporated substrate 1A illustrated in FIG. 12 is manufactured.

In addition to advantages (1) to (5) of the first embodiment, the second embodiment has the following advantage.

(6) Each spacer unit 6A, which electrically connects the first substrate 2 and the second substrate 5, has a stacked structure of the cored solder ball 42, the metal post 40, and the cored solder ball 50, which are stacked in the stacking direction of the first substrate 2 and the second substrate 5. That is, the spacer unit 6A is formed with a stacking structure of three connection terminals (metal post 40 and cored solder balls 42 and 50). Thus, in comparison with when the spacer unit 6A is formed by only one connection terminal (metal post or cored solder ball) or two connection terminals, the diameter of each connection terminal (that is, the dimension in a direction perpendicular to the stacking direction of the substrates 2 and 5) may be decreased. This allows for the minimum pitch to be narrowed in which the spacer units 6A are arranged. Thus, the pitch of the connection pads P2 and P5 may easily be narrowed when the wiring patterns 20 and 36 and the like are miniaturized.

It should be apparent to those skilled in the art that the present invention may be embodied in many other specific forms without departing from the spirit or scope of the invention. Particularly, it should be understood that the present invention may be embodied in the following forms.

In each of the above embodiments, the metal layer (plating layer) may be formed on the upper surface 63A of each projection 63 (surface that becomes the upper surface 40A of the metal post 40) on the metal plate 60. In this case, an example for processing the metal plate 60 will now be described with reference to FIGS. 16A to 17E.

Figure 16A:
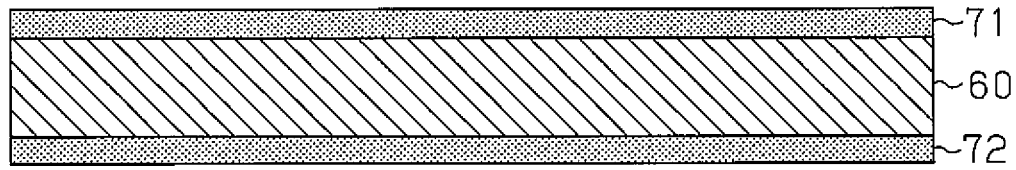
FIGS. 16A to 16D and 17A to 17E are schematic cross-sectional views illustrating a method for manufacturing a modification of an electronic component incorporated substrate.
Figure 16B:
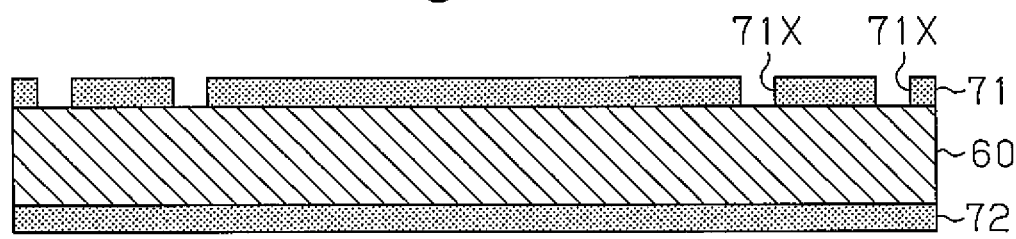

In the step illustrated in FIG. 16A, a resist layer 71 is formed to entirely cover the upper surface of the metal plate 60, and a resist layer 72 is formed to entirely cover the lower surface of the metal plate 60. Then, in the step illustrated in FIG. 16B, openings 71X are formed in the resist layer 71 at certain locations (locations where the metal posts 40 are formed). Taking into consideration the plating process performed in the next step, the materials of the resist layers 71 and 72 may be resistant to plating. For example, a photosensitive dry film resist or a liquid photoresist (e.g., dry film resist or liquid photoresist such as novolac resin or acrylic resin) may be used as the material of the resist layers 71 and 72. When using, for example, a photosensitive dry film resist, thermal compression bonding is performed to laminate the dry film on both of the upper and lower surfaces of the metal plate 60, and the dry film laminated on the upper surface of the metal plate 60 is exposed and developed. This patterns the dry film and forms the openings 71X. As a result, the resist layer 71 including the openings 71X is formed on the upper surface of the metal plate 60, and the resist layer 72 is formed entirely covering the lower surface of the metal plate 60. When using a liquid photoresist, the same step may be performed to form the resist layers 71 and 72.

Figure 16C:
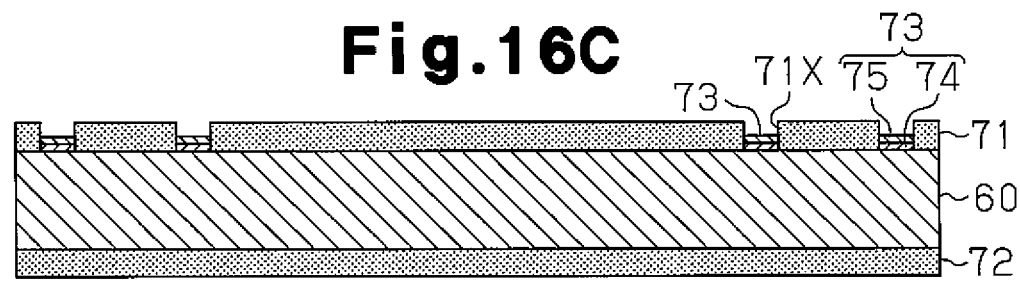

In the step illustrated in FIG. 16C, electrolytic plating is performed on the upper surface of the metal plate 60 using the resist layers 71 and 72 as plating masks. The electrolytic plating uses the metal plate 60 as a plating power supply layer. More specifically, an electrolytic plating process is performed on the upper surface of the metal plate 60 exposed from the openings 71X of the resist layer 71 to form a metal layer 73. When the metal layer 73 is a stacked structure of an Ni layer 74 and an Au layer 75, the electrolytic plating process sequentially stacks the Ni layer 74 and the Au layer 75 on the metal plate 60 exposed from each opening 71X of the resist layer 71.

Figure 16D:
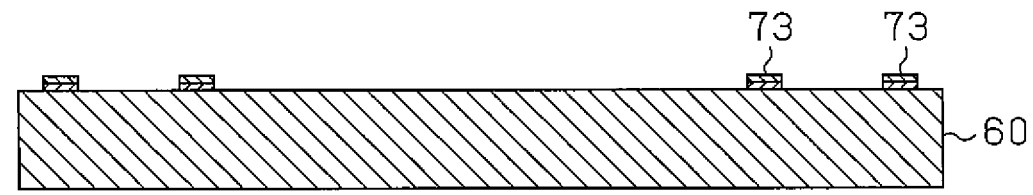

In the step illustrated in FIG. 16D, the resist layers 71 and 72 illustrated in FIG. 16C are removed with an alkali defoliation liquid.

Figure 17A:
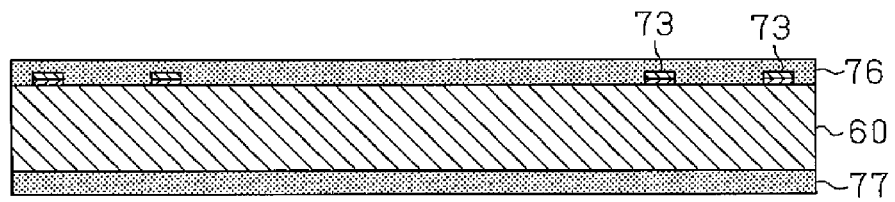
Figure 17B:
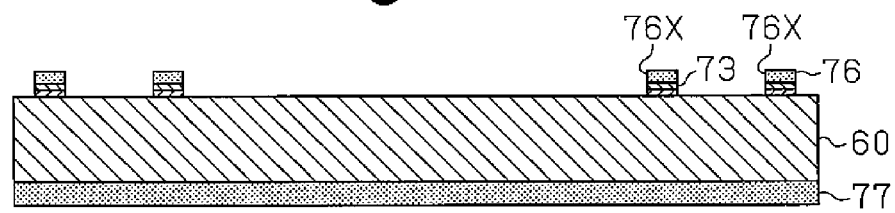

In the step illustrated in FIG. 17A, a resist layer 76 is formed to entirely cover the upper surfaces of the metal layer 73 and the metal plate 60. Further, a resist layer 77 is formed to entirely cover the lower surface of the metal plate 60. Then, in the step illustrated in FIG. 17B, openings 76X are formed in the resist layer 76 leaving the resist layer 76 at certain locations where the metal layer 73 is formed, that is, where the metal posts 40 are to be formed. Taking into consideration the etching process performed in the next step, the materials of the resist layers 76 and 77 may be resistant to etching. For example, the material of the resist layers 76 and 77 may be the same as the materials of the resist layers 61 and 62.

Figure 17C:
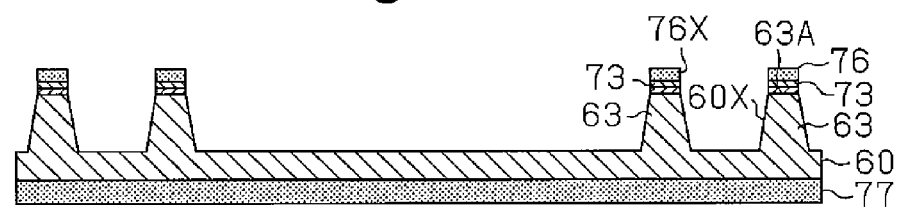

In the step illustrated in FIG. 17C, half etching is performed using the resist layers 76 and 77 and the metal layer 73 as etching masks to thin the metal plate 60 exposed from the openings 76X to a certain depth. This forms recesses 60X in portions of the metal plate 60 exposed from the openings 76X. In other words, portions of the metal plate 60 covered by the resist layer 76 and the metal layer 73 form projections 63. This forms the metal layer 73 on the upper surface 63A of each projection 63.

Figure 17D:

In the step illustrated in FIG. 17D, the resist layers 76 and 77 illustrated in FIG. 17C are removed with, for example, an alkali defoliation liquid.

Figure 17E:

In the step illustrated in FIG. 17E, the cored solder ball 42 is mounted on the upper surface of the metal layer 73 (upper surface of Au layer 75) on the upper surface 63A of the projection 63. The cored solder ball 42 may be mounted after applying flux to the upper surface of the Au layer 75. Then, a reflow process is performed at a temperature of approximately 230° C. to 260° C. to fix the cored solder ball 42 to the upper surface of the Au layer 75. Then, the surface is washed to remove the flux.

In this manner, by forming the metal layer 73 on the upper surface 63A of each projection 63 (upper surface 40A of each metal post 40), the connectivity of the metal post 40 and the cored solder ball 50 (or the metal post 40 and the connection pad P5) may be improved.

The insulation layers 41 and 46 in each of the above embodiments may be formed as described below.

Figure 18A:
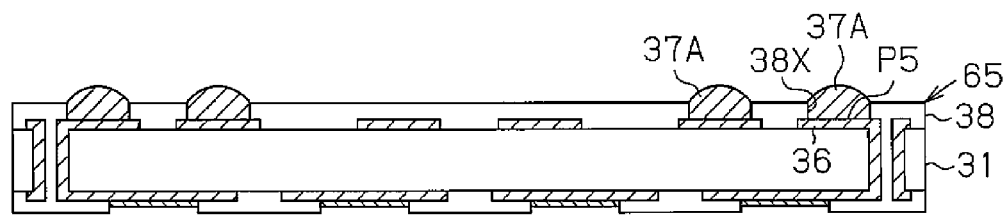
FIGS. 18A to 18D are schematic cross-sectional views illustrating a method for manufacturing another modification of an electronic component incorporated substrate.

First, in the step illustrated in FIG. 18A, in the same manner as the steps illustrated in FIGS. 7A and 7B, a structure corresponding to the second substrate 5 is formed in each substrate formation region A2 of the substrate material 65. Further, solder 37A is formed on each connection pad P5 of the substrate material 65.

Figure 18B:
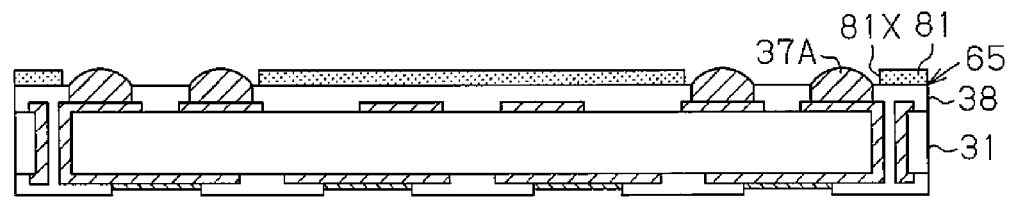

In the step illustrated in FIG. 18B, a defoliation film 81 including openings 81X corresponding to the pattern of the insulation layer 41 is adhered to the solder resist layer 38. The openings 81X of the defoliation film 81 expose the solder 37A and the solder resist layer 38 at the periphery of the solder 37A. For example, the openings 81X are punched out in advance from the defoliation film 81 with a die before the defoliation film 81 is adhered to the solder resist layer 38. Alternatively, after the defoliation film 81 is adhered to the entire upper surface of the solder resist layer 38, a laser or the like may be used to cut the defoliation film 81 along the contour of the openings 81X. Then, the defoliation film 81 may be removed to form the openings 81X.

Vinyl chloride or a PET film may be used as the material of the defoliation film 81. An adhesive agent formed from an acrylic resin is applied to the lower surface of the defoliation film 81, and the defoliation film 81 is tentatively adhered to allow for easy removal from the solder resist layer 38.

Figure 18C:
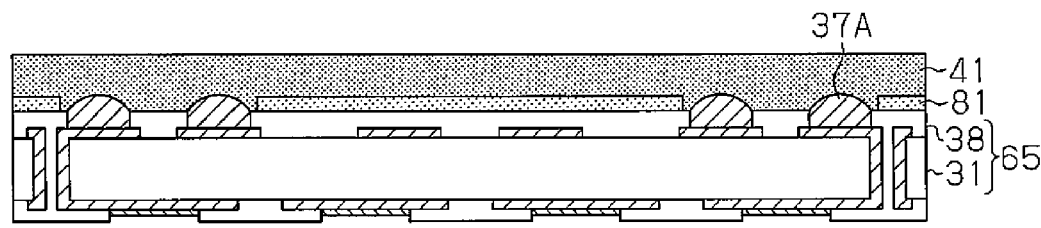

In the step illustrated in FIG. 18C, the insulation layer 41, which is in a B-stage state, is formed on the solder resist layer 38 and the defoliation film 81 to entirely cover the upper surface of the substrate material 65.

Figure 18D:
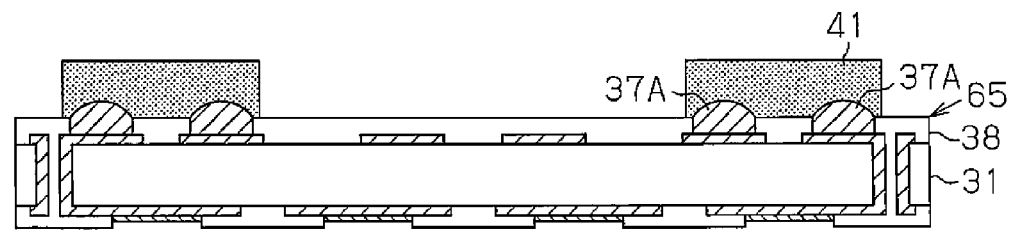

Then, the defoliation film 81 is removed from the substrate material 65. Here, portions of the insulation layer 41 arranged on the defoliation film 81 are torn apart from portions of the insulation layer 41 that are not arranged on the defoliation film 81 (i.e., from insulation layer 41 formed on the solder resist layer 38 and solder 37A) and thereby removed from the substrate material 65 together with the defoliation film 81. FIG. 18D illustrates the cross-sectional structure subsequent to the removal of the defoliation film 81. In this step, the insulation layer 41 is in a semi-cured state. Thus, the insulation layer 41 may easily be torn apart in the thickness-wise direction by removing the defoliation film 81 from the substrate material 65.

The insulation layer 41 that is similar to that of the first embodiment may be formed through the method described above. A modification of the method for forming the insulation layer 41 of the first embodiment has been described. The method for forming the insulation layer 46 of the second embodiment may be modified in the same manner.

In each of the above embodiments, the insulation layers 41 and 46 are frame-shaped as viewed from above. However, the insulation layers 41 and 46 may be any other shape. For example, as illustrated in FIG. 19, the insulation layer 41 may be formed so that a first region C1, which is frame-shaped as viewed from above and includes the metal posts 40, includes first non-formation regions D1, each of which is free from the insulation layer 41. The inner side of the first region C1 is defined as a second non-formation region D2 where the insulation layer 41 is not formed. Further, the outer side of the first region C1 is defined as a third non-formation region D3 where the insulation layer 41 is not formed. The first non-formation regions D1 connect the second non-formation region D2 and the third non-formation region D3. The first non-formation regions D1 allow for the first to third non-formation regions D1, D2, and D3 to be spatially continuous. Thus, when filling the encapsulating resin 7 into the space between the substrate material 65 and the substrate material 66, resin (e.g., molding resin) flows from the third non-formation region D3 to the second non-formation region D2 through the first non-formation regions D1 and from the second non-formation region D2 to the third non-formation region D3 through the first non-formation regions D1. Thus, in the space between the substrate material 65 (second substrate 5) and the substrate material 66 (first substrate 2), even if the ratio of the insulation layer 41 occupying the space in the thickness-wise direction becomes high, the resin may be filled without being affected by the ratio.

Moreover, in this modification, the first non-formation regions D1 lie along straight lines as viewed from above. Thus, the resin drawn into the second non-formation region D2 from the first non-formation regions D1 at one side may smoothly enter the third non-formation region D3 through the first non-formation regions D1 at the other side. Accordingly, in the space between the substrate material 65 (second substrate 5) and the substrate material 66 (first substrate 2), even if the ratio of the insulation layer 41 occupying the space in the thickness-wise direction becomes high, the resin may be filled without being affected by the ratio.

In this modification, a plurality of first non-formation regions D1 are formed in the first region C1. However, the first region C1 may include only one first non-formation region D1.

In each of the above embodiments, the metal posts 40 and the connection pads P2 and P5 are arranged at positions surrounding the peripheral edge of the semiconductor chip 3 as viewed from above. However, the layout is not limited in each of the above embodiments. For example, as illustrated in FIG. 20, any one or more of the four sides surrounding the semiconductor chip 3 (in this case, one side) may be free from the metal posts 40 and the connection pads P5. In other words, the metal posts 40 and the connection pads P5 may be formed in any three of the four sides surrounding the semiconductor chip 3. In this case, the insulation layer 41 is U-shaped as viewed from above.

In each of the above embodiments, the lower surface 40B of each metal post 40 is located above the lower surfaces 41B and 46B of the insulation layers 41 and 46 (refer to FIGS. 3 and 12). Instead, for example, the lower surface 40B of each metal post 40 may be flush with the lower surfaces 41B and 46B of the insulation layers 41 and 46.

In each of the above embodiments, the edges of the through holes 41X and 46X located toward the lower surfaces 40B of the metal posts 40, that is, the open ends of the through holes 41X and 46X of the insulation layers 41 and 46 are chamfered but do not have to be chamfered.

In each spacer unit 6 of the first embodiment, the metal post 40 is bonded to the connection pad P5 of the second substrate 5, and the cored solder ball 50 is bonded to the connection pad P2 of the first substrate 2. Instead, for example, the metal post 40 may be bonded to the connection pad P2 of the first substrate 2, and the cored solder ball 50 may be bonded to the connection pad P5 of the second substrate 5.

In each of the above embodiments, after bonding the spacer units 6 and 6A to the connection pads P5 of the second substrate 5, the spacer units 6 and 6A are bonded to the connection pads P2 of the first substrate 2 to electrically connect the second substrate 5 to the first substrate 2. Instead, for example, after bonding the spacer units 6 and 6A to the connection pads P2 of the first substrate 2, the spacer units 6 and 6A may be bonded to the connection pads P5 of the second substrate 5 to electrically connect the second substrate 5 to the first substrate 2. In this case, the semiconductor chip 3 is flip-chip mounted on the first substrate 2 after bonding the spacer units 6 and 6A to the connection pads P2.

In the above embodiments, the copper core balls 43 and 51 are used as conductive core balls of the cored solder balls 42 and 50. Instead, a conductive core ball may be formed from a metal other than copper, for example, gold, nickel, or the like. Alternatively, a solder ball without a conductive core ball may be used in lieu of each of the cored solder balls 42 and 50.

In the first substrate 2 of each of the above embodiments, the structure of the layers located inward from the wiring patterns 20 and 23 that are the outermost layers are not particularly limited. That is, the first substrate 2 only needs to have a structure electrically connecting the wiring patterns 20 and 23 of the outermost layers to each other through the interior of the substrate. The structure and material of the substrate core 11 is not particularly limited. Further, the number of wires (e.g., wires 15 and 16) formed on the substrate core 11 and number of insulation layers (e.g., insulation layers 13 and 14) covering the wires are not particularly limited. Further, the substrate body 10 may be replaced by a cored build-up substrate including the substrate core 11 or a coreless substrate that does not include the substrate core 11.

In the first substrate 2 of each of the above embodiments, the metal layers 21 and 24 may be omitted.

In the second substrate 5 of each of the above embodiments, the structure of the layers located inward from the wiring patterns 33 and 36 that are the outermost layers are not particularly limited. That is, the second substrate 5 only needs to have a structure electrically connecting the wiring patterns 33 and 36 of the outermost layers to each other through the interior of the substrate. The structure and material of the substrate core 31 is not particularly limited. Further, a certain number of wires may be formed on the substrate core 31, and a certain number of insulation layers may cover the wires. Additionally, the second substrate 5 may be a coreless substrate that does not include the substrate core 31.

In the second substrate 5 of each of the above embodiments, the metal layer 34 may be omitted. Further, in the second substrate 5 of the second embodiment, the metal layer 39 may be omitted.

In each of the above embodiments, the manufacturing method is applied for case when a plurality of products are manufactured simultaneously in batches. Instead, the manufacturing method may be applied to when a single product is manufactured.

CLAUSES

This disclosure further encompasses various embodiments described below.

1. A method for manufacturing an electronic component incorporated substrate, the method comprising:
preparing a first substrate, which includes a first pad, and a second substrate, which includes a second pad;
bonding a spacer unit to the second pad;
bonding the spacer unit to the first pad thereby electrically connecting the second substrate to the first substrate through the spacer unit; and filling an encapsulating resin between the first substrate and the second substrate to encapsulate an electronic component that is arranged between the first substrate and the second substrate, wherein
- the bonding a spacer unit to the second pad includes
- thinning a metal plate at a certain location to form a projection,
- forming a semi-cured insulation layer above the second pad,
- opposing a first surface of the projection toward the second pad,
- fixing the metal plate to the second substrate through the insulation layer to electrically connect the projection to the second pad,
- thinning the metal plate by leaving only the projection or only a portion of the projection, and
- mounting a solder ball on a second surface of the projection that is located opposite to the first surface of the projection,
- wherein the spacer unit includes a stacked structure, which is of the projection and the solder ball, and the insulation layer that covers a side wall of the projection.

2. The method according to clause 1, wherein
the bonding a spacer unit to the second pad further includes
forming a first solder on the first surface of the projection,
forming a second solder on the second pad, and
forming the semi-cured insulation layer to cover the second solder, and
the fixing the metal plate to the second substrate includes bonding the second pad and the projection with the first solder and the second solder.

3. The method according to clause 1, wherein
the bonding a spacer unit to the second pad further includes
mounting a second solder ball on the first surface of the projection, and
forming the semi-cured insulation layer to cover the second pad, and
the fixing the metal plate to the second substrate includes bonding the second solder ball to the second pad.

4. The method according to clause 2, wherein the thinning the metal plate by leaving only the projection or only a portion of the projection includes thinning the metal plate until the second surface of the projection hollows toward the first surface of the projection from a first surface of the insulation layer.

The present examples and embodiments are to be considered as illustrative and not restrictive, and the invention is not to be limited to the details given herein, but may be modified within the scope and equivalence of the appended claims.

The invention claimed is:

1. An electronic component incorporated substrate comprising:
   a first substrate;
   a second substrate;
   a spacer unit that electrically connects the first substrate and the second substrate;
   an electronic component mounted on the first substrate and arranged between the first substrate and the second substrate; and
   an encapsulating resin that fills a space between the first substrate and the second substrate to encapsulate the electronic component,
   wherein the spacer unit includes
      a stacked structure of a metal post and a solder ball stacked in a stacking direction of the first substrate and the second substrate, and
      an insulation layer that is formed on the second substrate and covers a side wall of the metal post at a position away from the first substrate,
   the solder ball is formed by a metal core ball and solder which encompasses the metal core ball,
   the metal post includes the side wall, an upper surface connected to the second substrate, and a lower surface connected to the solder ball, and
   the spacer unit has a height corresponding to the total height of the metal post and the diameter of the metal core ball, the height of the spacer unit defines a separated distance between the first substrate and the second substrate.

2. The electronic component incorporated substrate according to claim 1, wherein
   the metal post includes a first surface including a recess, and
   the solder ball is bonded to the first surface of the metal post.

3. The electronic component incorporated substrate according to claim 1, wherein
   the metal post includes a second surface opposite to the first surface,
   the insulation layer includes a first surface that exposes the first surface of the metal post,
   the first surface of the metal post hollows toward the second surface of the metal post from the first surface of the insulation layer, and
   the solder ball is bonded to the first surface of the metal post exposed from the first surface of the insulation layer.

4. The electronic component incorporated substrate according to claim 3,
   wherein the metal post is arranged in a first region defined between the first substrate and the second substrate,
   the first region is frame-shaped as viewed from above and includes a first non-formation region that is free from the insulation layer, and
   the first non-formation region includes a second non-formation region, which is located at an inner side of the first region, and a third non-formation region, which is located at an outer side of the first region.

5. The electronic component incorporated substrate according to claim 1, wherein the solder ball is a cored solder ball, which includes a conductive core ball and solder encompassing the conductive core ball.

6. The electronic component incorporated substrate according to claim 1, wherein
   the stacked structure further includes an additional solder ball stacked between the second substrate and the metal post, with the metal post being located between the solder ball and the additional solder ball, and
   the insulation layer covers the side wall of the metal post and the additional solder ball.

7. An electronic component incorporated substrate comprising:
   a first substrate;
   a second substrate;
   a spacer unit that electrically connects the first substrate and the second substrate;
   an electronic component mounted on the first substrate and arranged between the first substrate and the second substrate; and
   an encapsulating resin that fills a space between the first substrate and the second substrate to encapsulate the electronic component, wherein the spacer unit includes
- a stacked structure of a metal post and a solder ball stacked in a stacking direction of the first substrate and the second substrate, and
- an insulation layer that is formed on the second substrate and covers a side wall of the metal post at a position away from the first substrate, the solder ball is formed by a metal core ball and solder which encompasses the metal core ball, the metal post includes the side wall, an upper surface connected to the second substrate, and a lower surface connected to the solder ball, and the spacer unit has a height corresponding to the total height of the metal post and the diameter of the metal core ball, the height of the spacer unit defines a separated distance between the first substrate and the second substrate, and wherein the height of the metal post is adjusted so that a change of pitch between adjacent spacer units is accommodated independent of the diameter of the metal core ball.

\* \* \* \* \*